United States Patent
Chen et al.

(10) Patent No.: US 10,867,859 B2
(45) Date of Patent: Dec. 15, 2020

(54) METHODS OF FABRICATING SEMICONDUCTOR DEVICES HAVING ISOLATION STRUCTURES WITH LINERS

(71) Applicant: Taiwan Semiconductor Manufacturing Co., Ltd., Hsinchu (TW)

(72) Inventors: Hsueh-Ju Chen, Taipei (TW); Xiong-Fei Yu, Hsinchu (TW); Chi-On Chui, Hsinchu (TW); Yee-Chia Yeo, Hsinchu (TW); Huicheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/964,862

(22) Filed: Apr. 27, 2018

(65) Prior Publication Data
US 2019/0157156 A1 May 23, 2019

Related U.S. Application Data

(60) Provisional application No. 62/587,763, filed on Nov. 17, 2017.

(51) Int. Cl.
*H01L 21/8234* (2006.01)
*H01L 21/02* (2006.01)
*H01L 21/762* (2006.01)

(52) U.S. Cl.
CPC .... *H01L 21/823431* (2013.01); *H01L 21/022* (2013.01); *H01L 21/0214* (2013.01); *H01L 21/0217* (2013.01); *H01L 21/0228* (2013.01); *H01L 21/0234* (2013.01); *H01L 21/02164* (2013.01); *H01L 21/02211* (2013.01); *H01L 21/02219* (2013.01); *H01L 21/02274* (2013.01);
(Continued)

(58) Field of Classification Search
CPC ....... H01L 43/065; H01L 43/14; H01L 43/04; G01R 33/0052; G01R 33/07
USPC ........................................ 438/283
See application file for complete search history.

(56) References Cited

U.S. PATENT DOCUMENTS 4,364,164 A * 12/1982 Bluzer ............. H01L 29/42396
257/248
8,796,666 B1 8/2014 Huang et al.
(Continued)

FOREIGN PATENT DOCUMENTS

WO WO 2006110645 * 4/2005

*Primary Examiner* — Mohammad M Hoque
(74) *Attorney, Agent, or Firm* — Birch, Stewart, Kolasch & Birch, LLP

(57) ABSTRACT

Methods of fabricating semiconductor devices are provided. The method includes forming a first fin and a second fin over a substrate, and conformally forming a silicon oxide layer over the first fin using a first atomic layer deposition (ALD) process. The method also includes conformally forming a silicon nitride layer over the silicon oxide layer using a second ALD process, and forming an insulating layer to fill the trench between the first fin and the second fin over the substrate. The method further includes recessing the insulating layer, the silicon oxide layer, and the silicon nitride layer to form an isolation structure with a liner. In addition, the method includes forming a gate structure over the first fin, and forming a source region and a drain region in the first fin and on opposite sides of the gate structure.

20 Claims, 21 Drawing Sheets

(52) U.S. Cl.
CPC .. *H01L 21/02332* (2013.01); *H01L 21/76224* (2013.01)

(56) References Cited

U.S. PATENT DOCUMENTS

| | | |
|---|---|---|
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2014/0134812 A1* | 5/2014 | Kim ................... H01L 21/28185 438/270 |
| 2014/0367795 A1* | 12/2014 | Cai .................... H01L 27/0886 257/392 |
| 2015/0102386 A1* | 4/2015 | Chen .................. H01L 29/0649 257/192 |
| 2018/0070868 A1* | 3/2018 | Lin ........................ G02B 6/122 |
| 2018/0226489 A1* | 8/2018 | Bi ..................... H01L 29/66666 |
| 2019/0067027 A1* | 2/2019 | Wang ................. H01L 29/7853 |
| 2020/0020697 A1* | 1/2020 | Kim .................. H01L 27/10855 |
| 2020/0032389 A1* | 1/2020 | Lei ..................... H01L 21/0262 |

\* cited by examiner

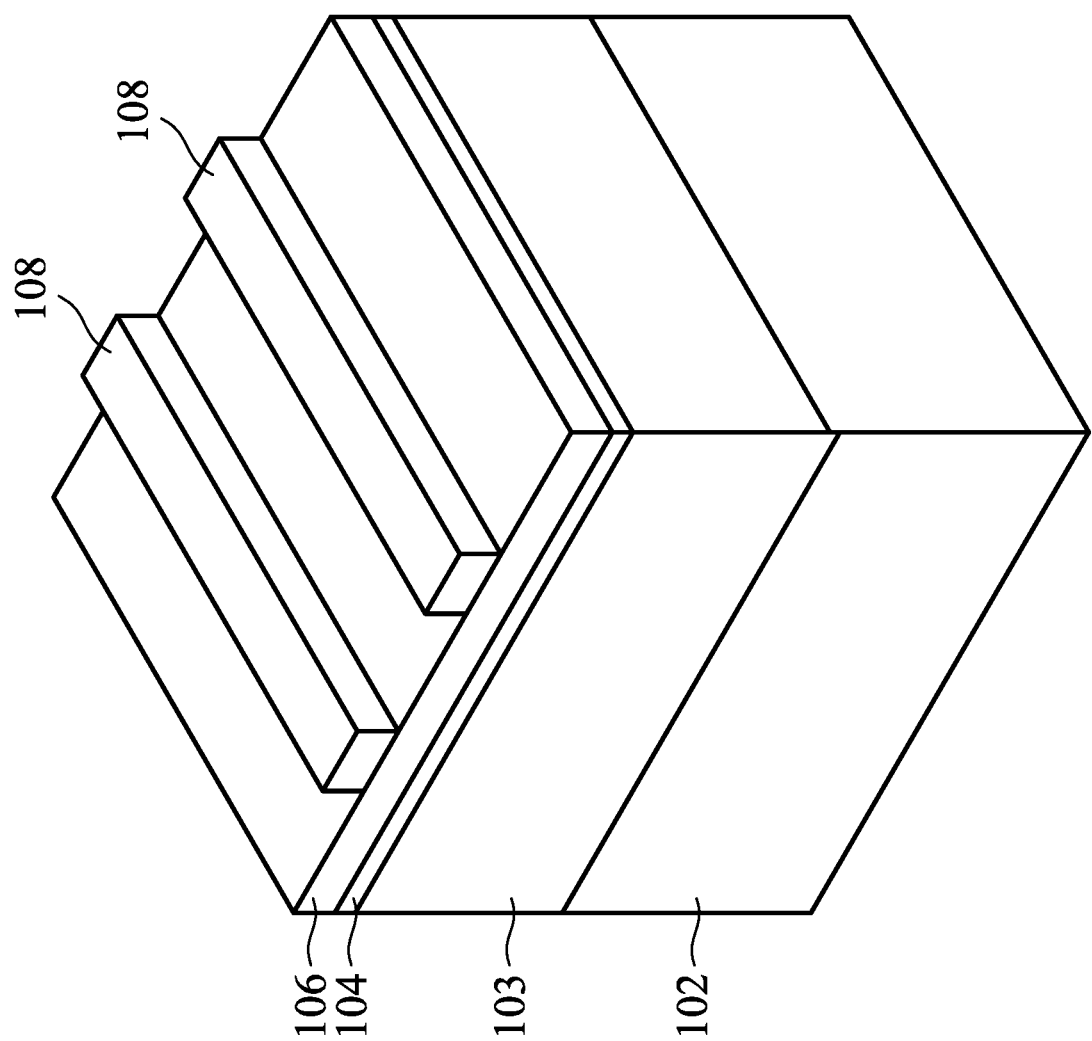

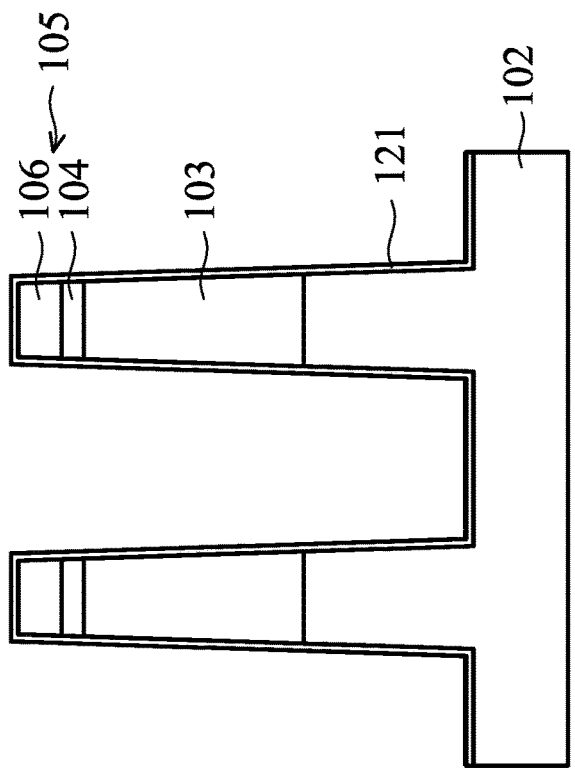
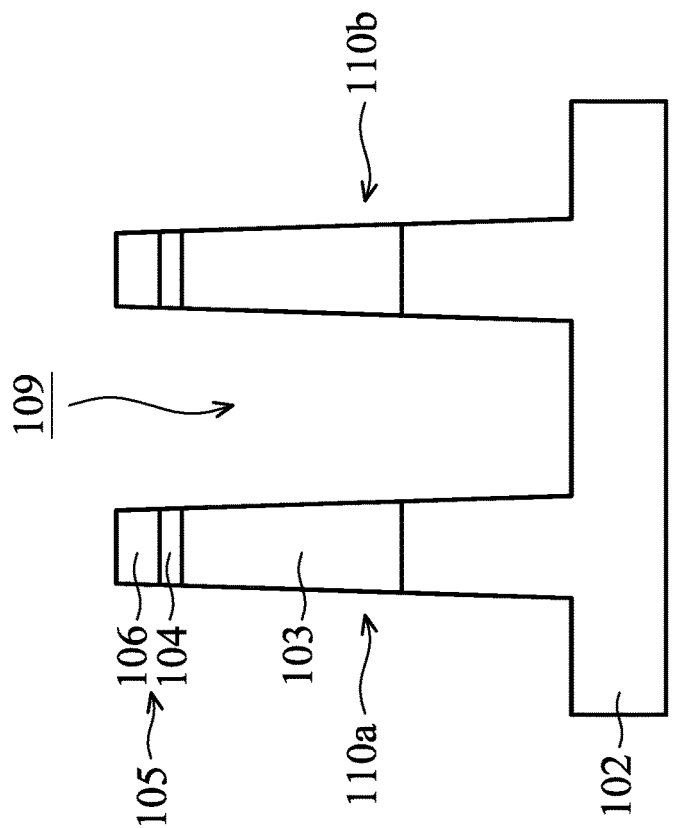

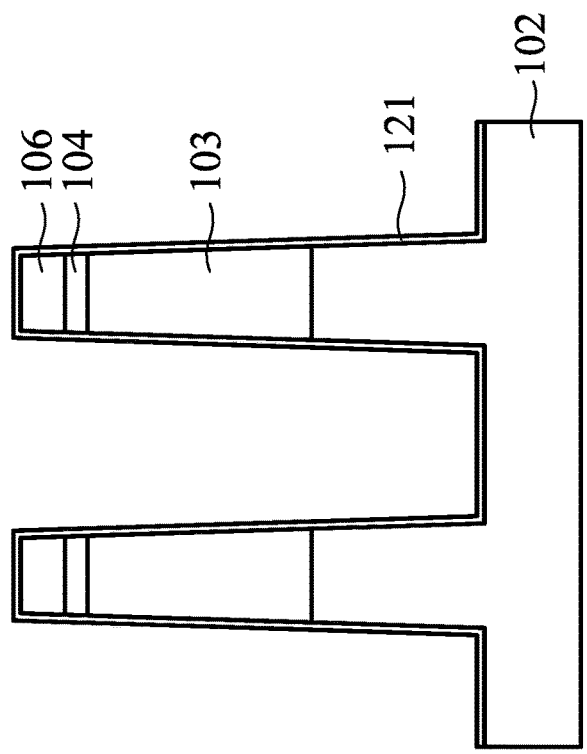
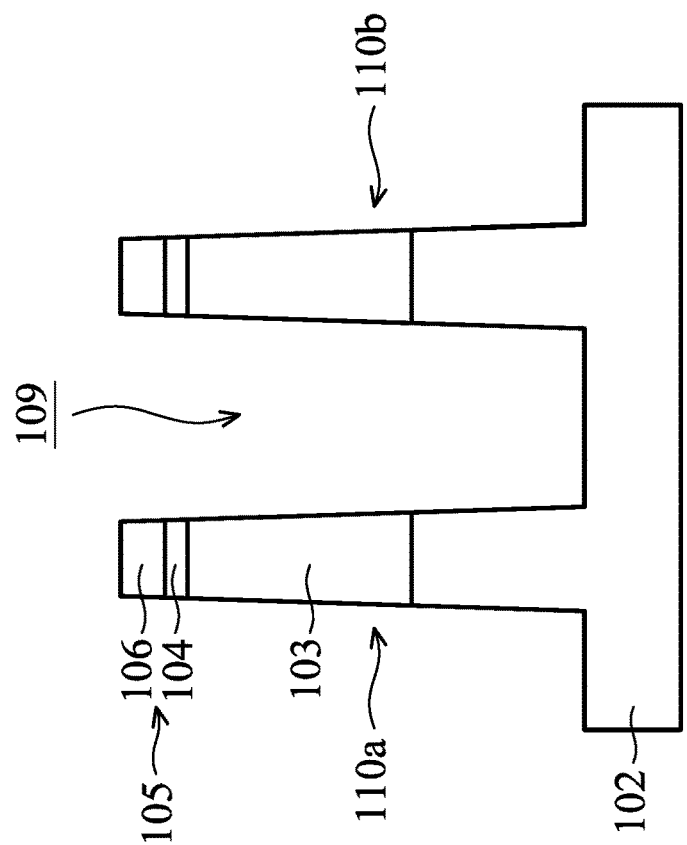
FIG. 4B
FIG. 4A

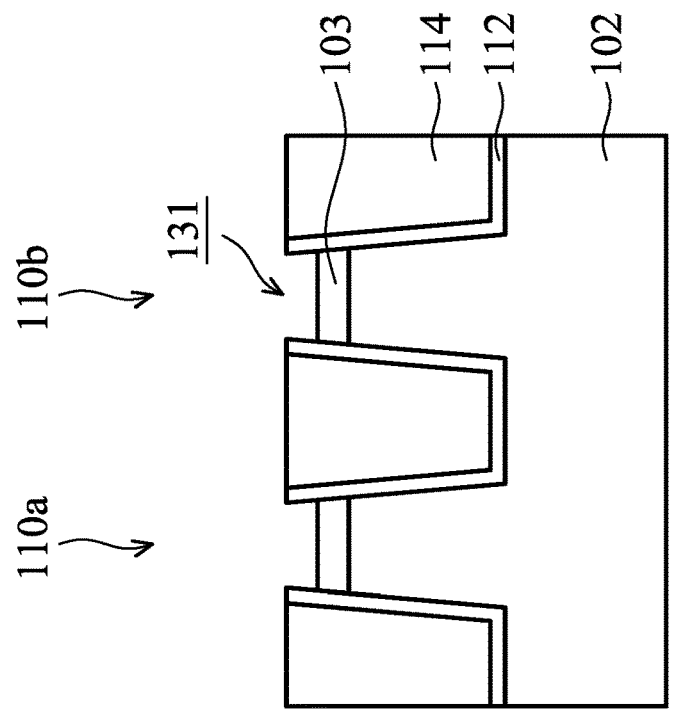
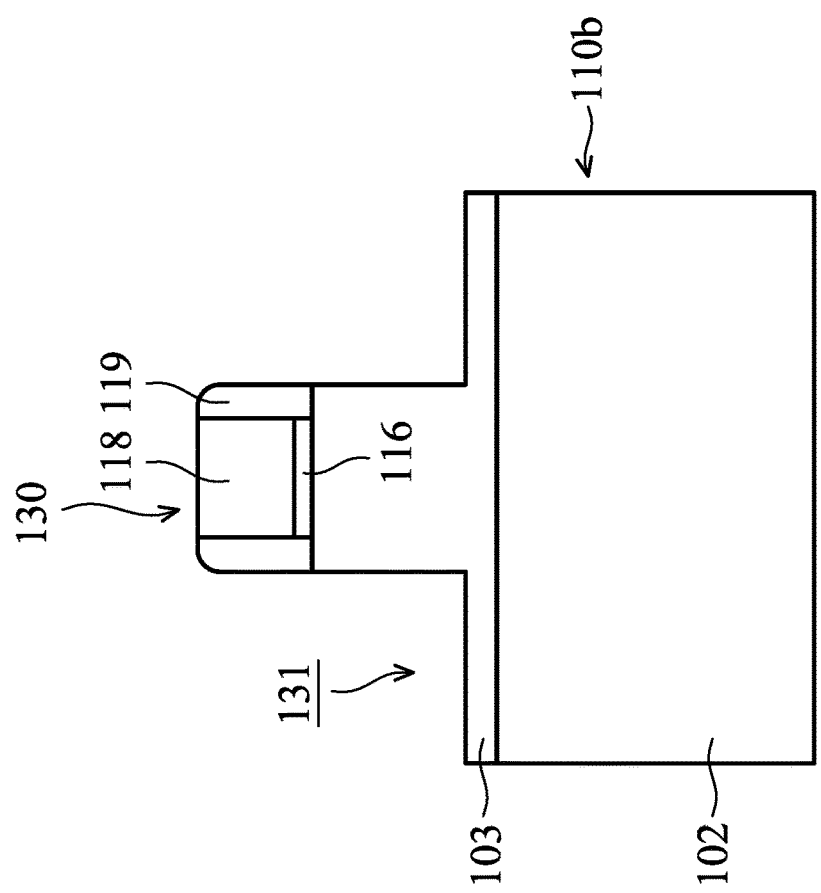
FIG. 7B
FIG. 7A

METHODS OF FABRICATING SEMICONDUCTOR DEVICES HAVING ISOLATION STRUCTURES WITH LINERS

PRIORITY CLAIM AND CROSS-REFERENCE

This application claims the benefit of U.S. Provisional Application No. 62/587,763, filed on Nov. 17, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a substrate, and patterning the various material layers using lithography to form circuit components and elements thereon.

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, new challenges are presented by such miniaturization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1F show perspective views of respective intermediate structures at various stages of forming a semiconductor device, in accordance with some embodiments.

FIGS. 2A-2I show cross-sectional views of respective intermediate structures taken along line I-I in FIGS. 1B-1E, in accordance with some embodiments.

FIGS. 4A-4H show cross-sectional views of respective intermediate structures taken along line I-I in FIGS. 1B-1E, in accordance with some embodiments.

FIGS. 6A-6B, 7A-7B, 8A-8B, and 9A-9B are cross-sectional views of respective intermediate structures at various stages of forming a semiconductor device after FIG. 1F and taken along line A-A and line B-B in FIG. 1F, in accordance with some embodiments.

DETAILED DESCRIPTION

Figure 1B:
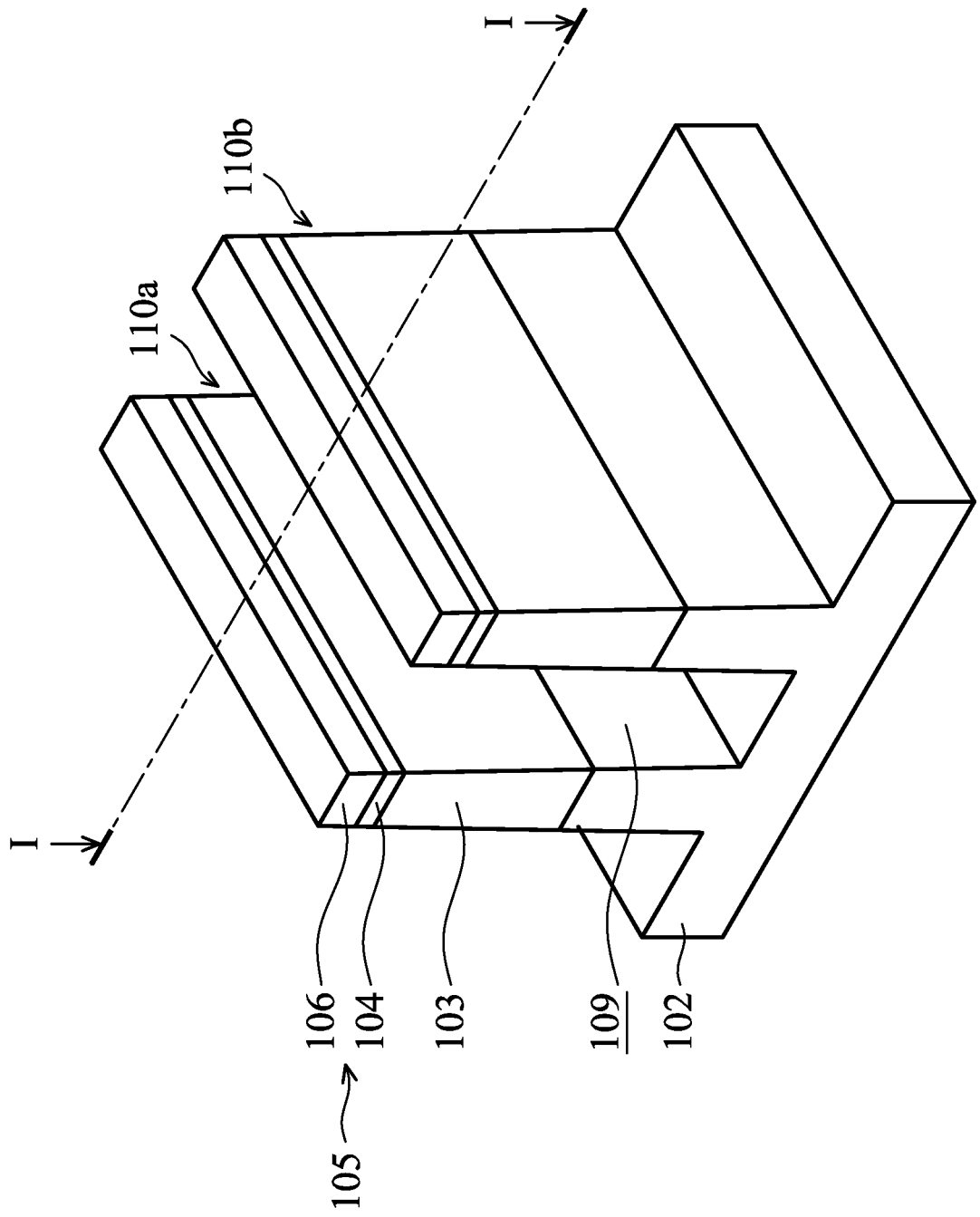

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional blocks can be provided before, during, and after the method, and some of the blocks described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments disclosed herein relate generally to fabricating semiconductor devices having an isolation structure with a liner for a fin made of a high-mobility material and to structures formed thereby. In some embodiments, the semiconductor devices are for example Fin Field Effect Transistor (FinFET) devices, and a portion of the fin of the FinFET devices is made of a high-mobility material that is used as a channel region of the FinFET devices. The high-mobility material may be a germanium (Ge)-containing material, such as silicon germanium (SiGe) or substantially pure Ge, which can enhance performance of the semiconductor devices.

According to embodiments of the disclosure, processes of forming a passivation layer on the fin that contains the high-mobility material are provided. The passivation layer is used as a liner of an isolation structure in the semiconductor devices. The isolation structure is disposed between neighboring fins in the FinFET devices. The processes of forming the passivation layer on the fin can prevent the loss of high-mobility material because the high-mobility material undergoes little to no oxidation, and this can prevent channel loss in the semiconductor devices. The process of forming the passivation layer impact on the high-mobility material of the fin is minimized.

In addition, the passivation layer formed on the fin according to the embodiments of the disclosure can minimize charge accumulation at the interface between the passivation layer and a well region in the fin, thereby avoiding well-junction leakage. Moreover, the passivation layer formed on the fin according to the embodiments of the disclosure can improve steam resistivity. Since the passivation layer is used as a liner for the isolation structure in the semiconductor devices, the reliability of the semiconductor devices is also enhanced.

In some embodiments, the passivation layer used as a liner for the isolation structure is a multi-layered structure formed on the high-mobility material of the fin using several deposition processes. The inner layer of the liner close to the fin may be a silicon oxide layer or a silicon oxynitride layer, and the outer layer of the liner far from the fin may be a silicon nitride layer. Both the inner and outer layers of the liner are formed by deposition processes to achieve the above-mentioned benefits. Other advantages of some embodiments may be also achieved.

The foregoing broadly outlines some aspects of embodiments described herein. Some embodiments described herein are described in the context of Fin Field Effect Transistor (FinFET) devices, and more particularly, in the context of an isolation structure liner formation for FinFET devices. Some variations of the example methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

Embodiments for forming semiconductor devices such as FinFET devices are provided. FIGS. 1A-1F show perspective views of respective intermediate structures at various stages of forming a semiconductor device 100 of FIG. 1F, in accordance with some embodiments.

A substrate 102 is provided, as shown in FIG. 1A in accordance with some embodiments. The substrate 102 may be a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a silicon or glass substrate. The substrate 102 may be made of silicon or other semiconductor materials. For example, the substrate 102 is a silicon wafer. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

In some embodiments, a germanium (Ge)-containing layer 103 is formed over the substrate 102. The Ge-containing layer 103 may be made of a high-mobility material having higher carrier mobility than silicon. In some embodiments, the Ge-containing layer 103 is made of substantially pure germanium (Ge), silicon germanium (SiGe), or silicon germanium carbide, for example. The Ge-containing layer 103 may be formed using an epitaxial process. The epitaxial process may include metal-organic chemical vapor deposition (MOCVD), molecular beam epitaxy (MBE), liquid phase epitaxy (LPE), vapor phase epitaxy (VPE), selective epitaxial growth (SEG), the like, or a combination thereof.

Afterwards, a buffer layer 104 may be formed over the Ge-containing layer 103 and a mask layer 106 may be formed over the buffer layer 104. In some examples, the buffer layer 104 may be made of dielectric material such as silicon oxide. The mask layer 106 may be single-layered or multi-layered structure. The mask layer 106 may be made of silicon nitride, silicon oxynitride, silicon carbide, silicon carbon nitride, the like, or a combination thereof. The buffer layer 104 and the mask layer 106 are individually deposited by chemical vapor deposition (CVD), physical vapor deposition (PVD), a high-density plasma chemical vapor deposition (HDPCVD) process, a spin-on process, a sputtering process, or another deposition process.

A patterned photoresist layer 108 is formed over the mask layer 106, as shown in FIG. 1A in accordance with some embodiments. The patterned photoresist layer 108 may be formed in a photolithography process. The photolithography process includes photoresist coating (e.g., spin-on coating), soft baking, mask aligning, exposure, post-exposure baking, developing the photoresist, rinsing and drying (e.g., hard baking).

Next, the buffer layer 104 and the mask layer 106 are patterned, as shown in FIG. 1B in accordance with some embodiments. The buffer layer 104 and the mask layer 106 may be patterned by using the patterned photoresist layer 108 as a mask in an etching process. The etching process may include a reactive ion etch (RIE), neutral beam etch (NBE), inductive coupled plasma (ICP) etch, the like, or a combination thereof. The etching process may be anisotropic. Subsequently, the patterned photoresist layer 108 is removed in an ashing process or a wet strip process. As a result, a patterned buffer layer 104 and a patterned mask layer 106 as shown in FIG. 1B in accordance with some embodiments are obtained.

Afterwards, the Ge-containing layer 103 and the substrate 102 are etched to form a number of fins (or fin structures) 110a and 110b by using the patterned buffer layer 104 and the patterned mask layer 106 as a mask. The patterned buffer layer 104 and the patterned mask layer 106 are referred to as a mask (e.g., a hard mask) 105 thereafter. The etching process may include a RIE, NBE, ICP etch, the like, or a combination thereof. The etch process may be anisotropic. A trench 109 is formed between neighboring pairs of fins 110a and 110b, as shown in FIG. 1B in accordance with some embodiments. In addition, the fins 110a and 110b protrude from the substrate 102.

Each of the fins 110a and 110b has a top portion and a bottom portion. In some embodiments, the top portion of each of fins 110a and 110b is formed from the Ge-containing layer 103, such as silicon germanium (SiGe) or germanium (Ge). The bottom portion is formed from the substrate 102 such as silicon (Si). A portion of the Ge-containing layer 103 directly under a gate structure (formed later) is used as a channel region. The Ge-containing layer 103 having compressive stress is suitable for providing increased carrier mobility, i.e., increased hole carrier mobility, for the channel region of P-type FinFET devices (PMOS devices).

In some examples, each of the fins 110a and 110b has a width that gradually increases from the top portion to the bottom portion. Each of the fins 110a and 110b has a tapered fin width which is gradually tapered from the bottom portion to the top portion.

Figure 1C:
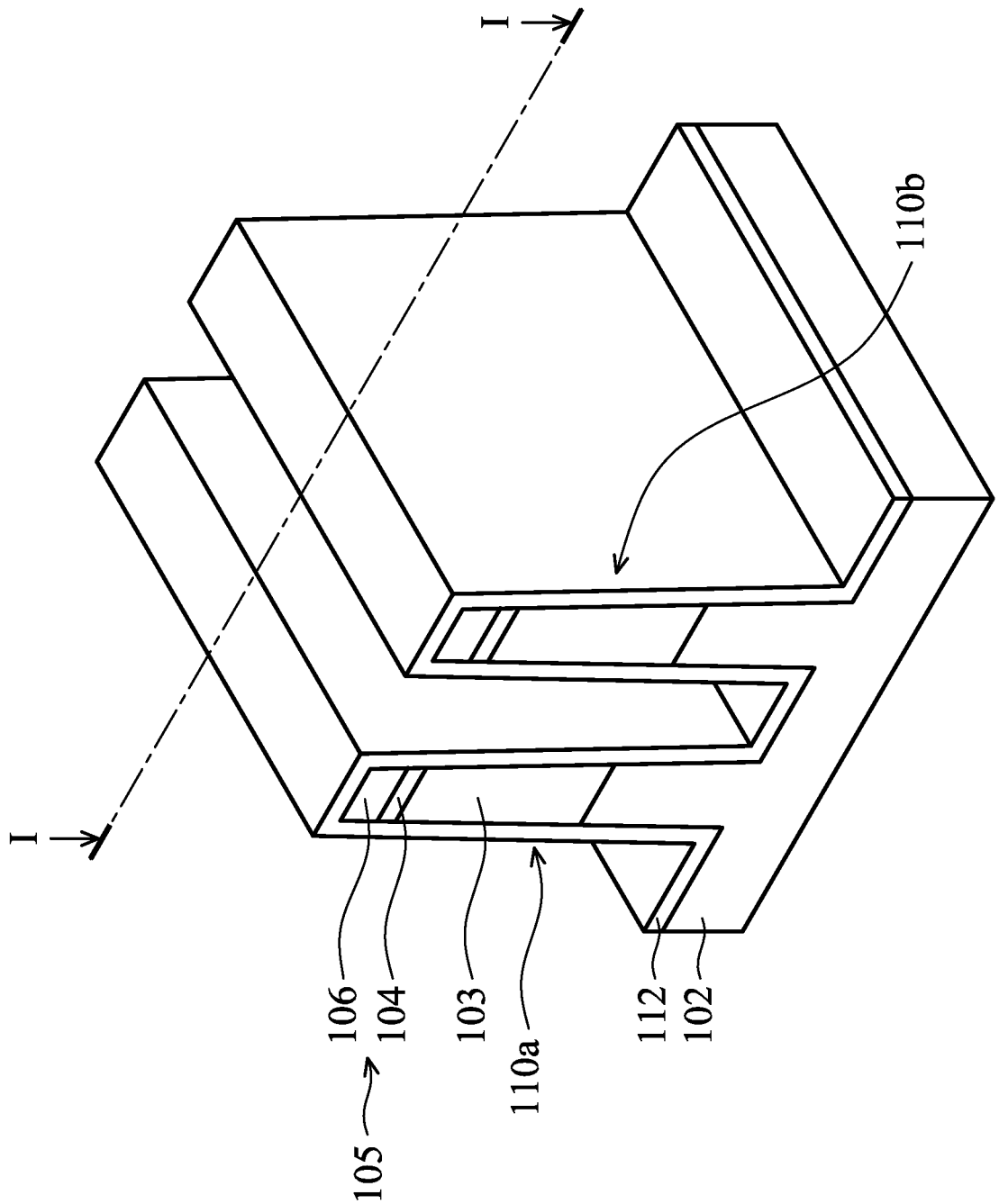

After the fins 110a and 110b are formed, a liner 112 (i.e., a passivation layer) is formed on the fins 110a and 110b and on the mask 105, as shown in FIG. 1C in accordance with some embodiments. More specifically, the liner 112 is conformally formed on the sidewall surfaces of the fins 110a and 110b, and on the sidewall surfaces and the top surfaces of the masks 105.

According to embodiments of the disclosure, the liner 112 is a multi-layered structure formed using several deposition processes. The detail of materials and processes for forming the liner 112 will be described later as referring to cross-sectional views of FIGS. 2A-2I and FIGS. 4A-4H, and flow charts of FIG. 3 and FIG. 5.

The liner 112 is used to protect the fins 110a and 110b from being damaged by following processes such as an anneal process or an etching process. Therefore, the profiles or shapes of the fins 110a and 110b are maintained or preserved by the protection of the liner 112. In addition, the liner 112 is used as a liner of an isolation structure (formed later) which is disposed between the neighboring fins 110a and 110b.

Figure 1D:
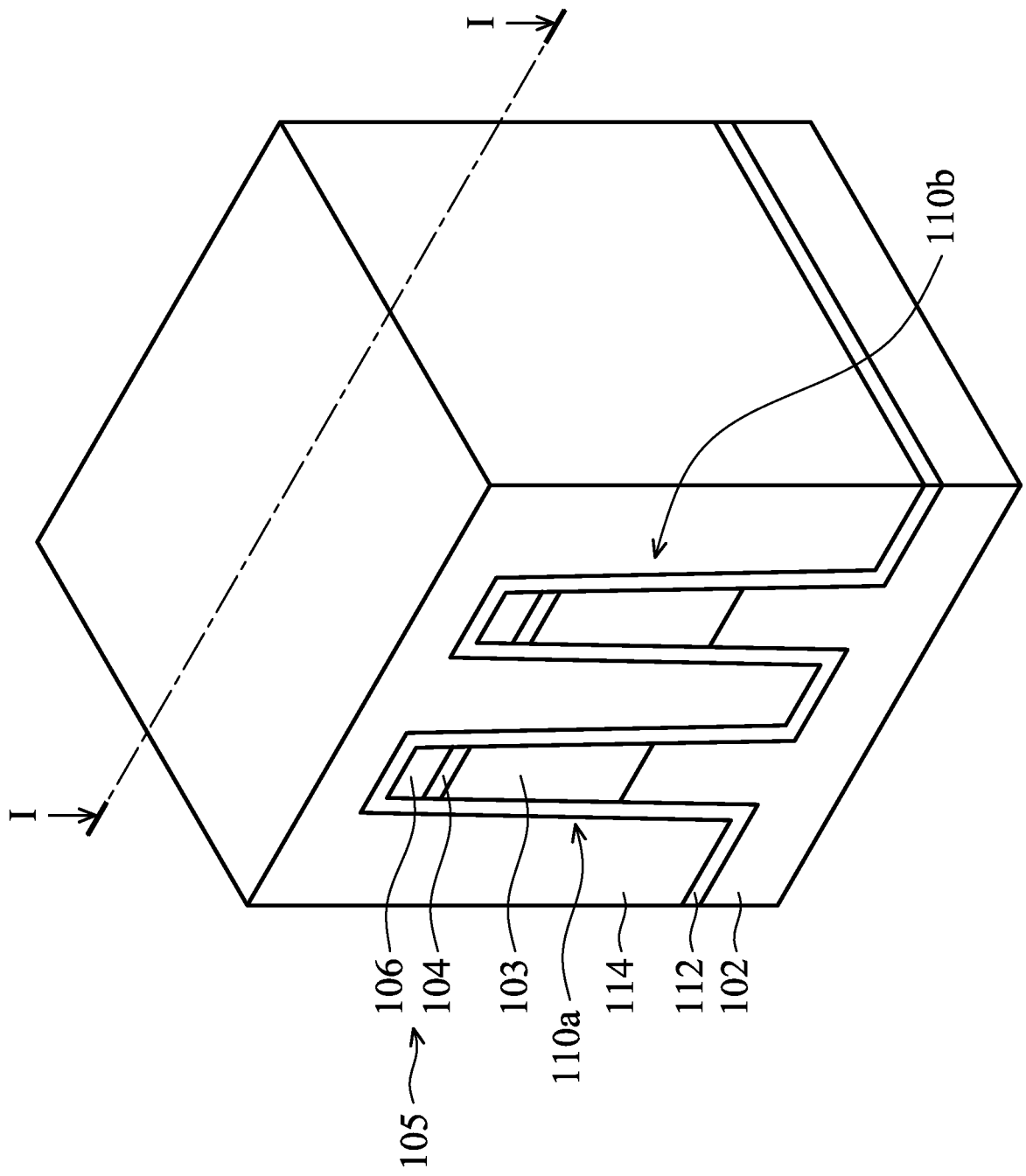

Next, an insulating layer 114 is formed to cover the fins 110a and 110b over the substrate 102, and to fill the trench 109 (as shown in FIGS. 1B-1C) between neighboring pairs of fins 110a and 110b, as shown in FIG. 1D in accordance with some embodiments. In some examples, the insulating layer 114 is made of silicon oxide, silicon nitride, silicon oxynitride, fluoride-doped silicate glass (FSG), or another low-k dielectric material. The insulating layer 114 may be formed using a deposition process, such as a CVD process, a spin-on-glass (SOG) process, or another applicable process.

Figure 1E:
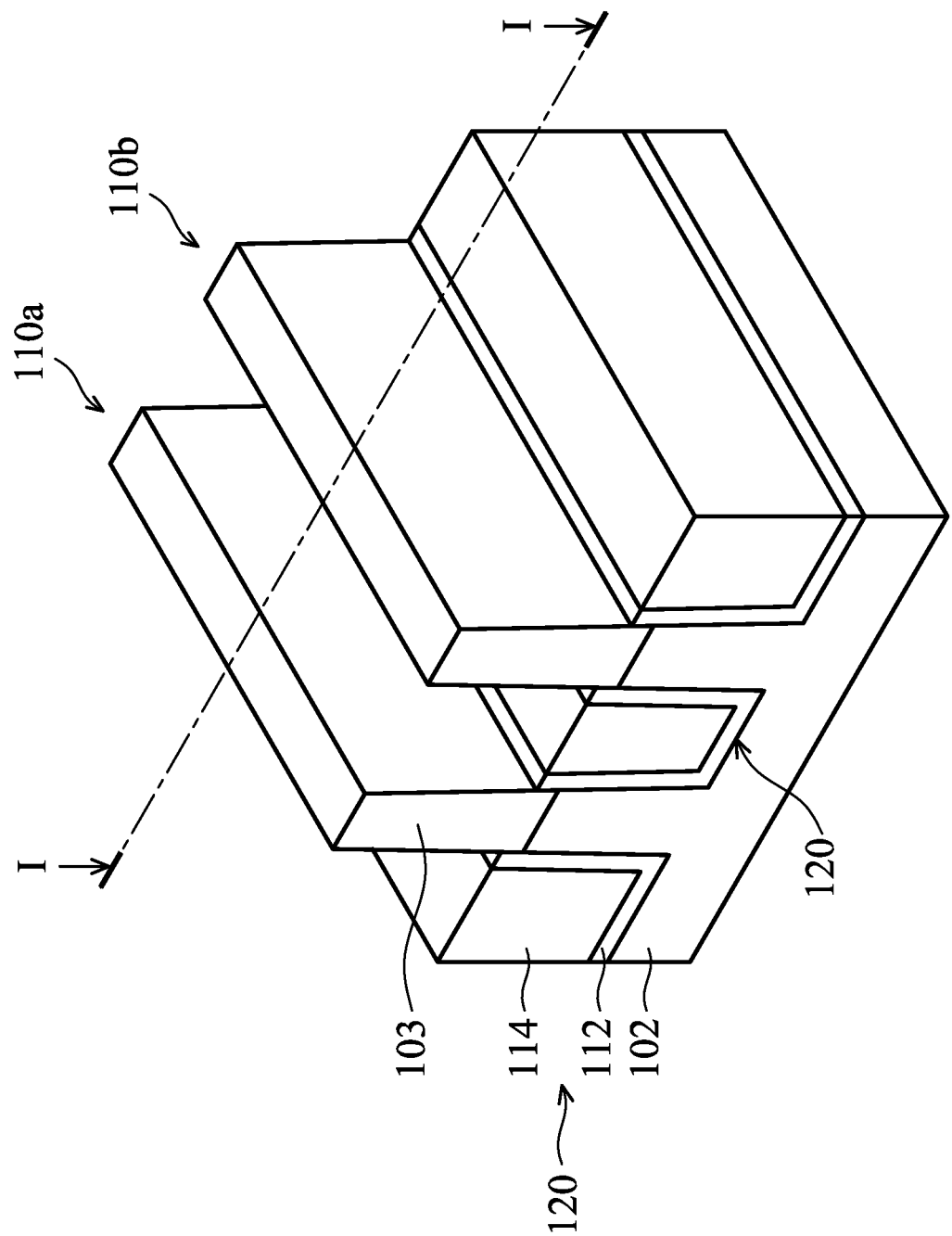

Next, the insulating layer 114 and the liner 112 are recessed to form an isolation structure 120, as shown in FIG. 1D and FIG. 1E in accordance with some embodiments. The isolation structure 120 includes a liner 112 and an insulating filler 114. The isolation structure 120 is for example a hallow trench isolation (STI) structure which surrounds the bottom portions of the fins 110a and 110b, and is disposed between the fins 110a and 110b. The insulating layer 114 and the liner 112 are recessed and the mask 105 is removed in a planarization process and an etching process. The planarization process is for example a chemical mechanical polishing (CMP) process, which expose the top surface of the patterned mask layer 106. The patterned mask layer 106 is then removed in a wet etching process that uses a phosphoric acid ($H_3PO_4$) etching solution, for example. Next, the patterned buffer layer 104, a portion of the liner 112 and a portion of the insulating layer 114 are removed in a dry etching process that uses etching gases. In some examples, the etching gases include hydrogen fluoride (HF) gas, ammonia ($NH_3$) gas, and dilute gas (such as $N_2$ or Ar).

Now, referring to FIGS. 2A-2I, which are cross-sectional views of respective intermediate structures for forming the isolation structure 120 as shown in FIG. 1E, when taken along line I-I in FIGS. 1B-1E, in accordance with some embodiments. Some processes and materials used to form the intermediate structures shown in FIGS. 2A-2I are similar to, or the same as, those used to form the intermediate structures shown in FIGS. 1B-1E, and those details are not repeated herein. At the same time, referring to FIG. 3, which is a flow chart of an example method 200 of forming an isolation structure with a liner corresponding to respective intermediate structures of FIGS. 2A-2I, in accordance with some embodiments.

Figure 2D:
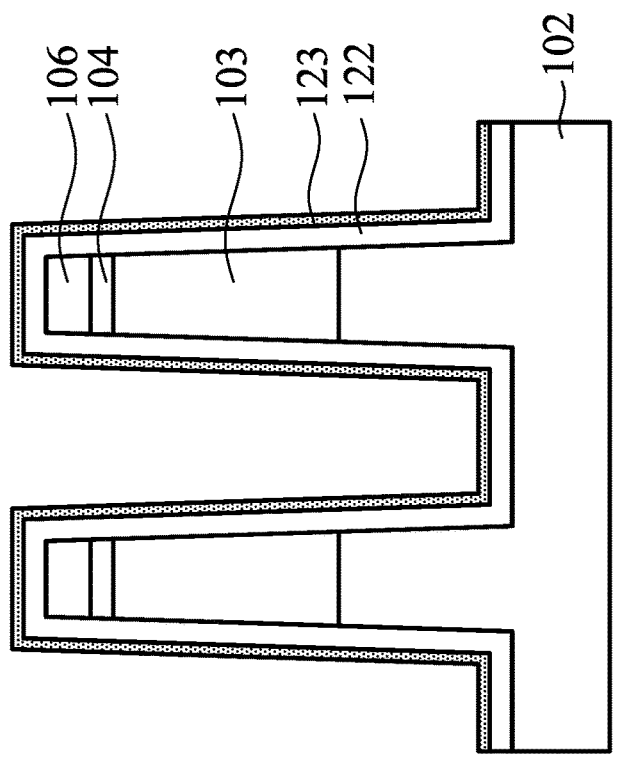
Figure 3:
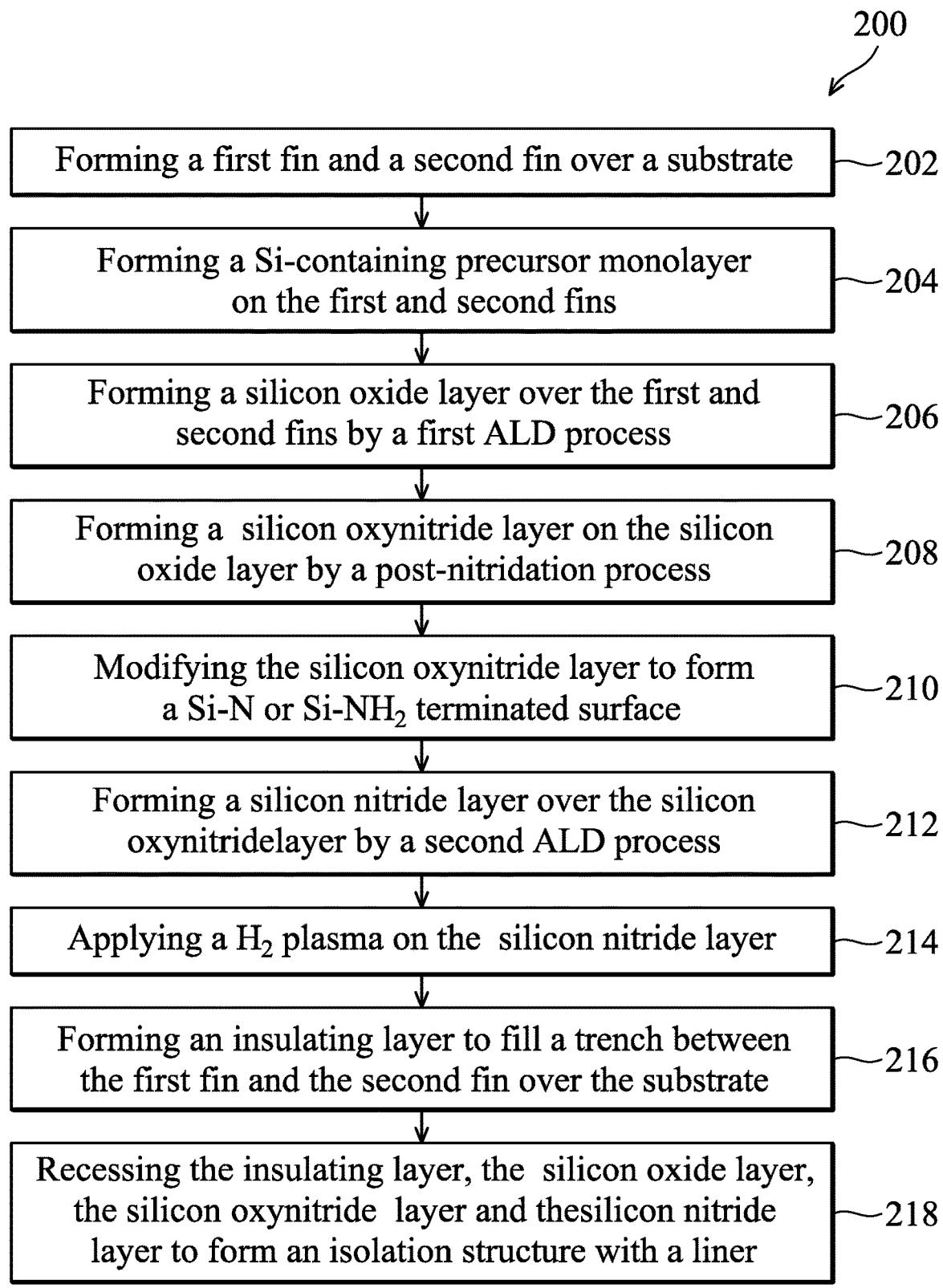
FIG. 3 is a flow chart of an example method of forming intermediate structures of the semiconductor device shown in FIGS. 2A-2I, in accordance with some embodiments.

In block 202 of the method 200 as shown in FIG. 3, a first fin 110a and a second fin 110b are formed over a substrate 102, as shown in FIG. 2A in accordance with some embodiments. In some embodiments, each of the first fin 110a and the second fin 110b has a bottom portion which is formed from a portion of the substrate 102, for example made of silicon wafer. In addition, each of the first fin 110a and the second fin 110b has a top portion, which is formed from the Ge-containing layer 103, for example made of SiGe or Ge. Moreover, a mask 105 is disposed over the first fin 110a and the second fin 110b. The mask 105 may be constructed by the patterned buffer layer 104 and the patterned mask layer 106. The patterned buffer layer 104 is for example a pad oxide layer, such as a silicon oxide layer. The patterned mask layer 106 is for example a pad nitride layer, such as a silicon nitride layer. The mask 105 is used as an etching mask for patterning the first fin 110a and the second fin 110b.

In block 204 of the method 200 as shown in FIG. 3, a Si-containing precursor monolayer 121 is formed on the first fin 110a and the second fin 110b, as shown in FIG. 2B in accordance with some embodiments. The Si-containing precursor monolayer 121 is conformally formed on the sidewalls of the first fin 110a and the second fin 110b, the exposed surface of the substrate 102, and the sidewalls and the top surface of the mask 105. In some embodiments, Si-containing precursor for forming the Si-containing precursor monolayer 121 may be an amino silane gas which is selected from the group consisting of bisdiethylaminosilane (BDEAS), diisopropylaminosilane (DIPAS), trisdimethylaminosilane (3DMAS), hexakisethylaminosilane (HEAD), hexakis(ethylamino)disilane (HEADS) and bisethylmethylaminosilane (BEMAS).

The Si-containing precursor monolayer 121 may be formed in the Si-precursor pre-soak step of a first atomic layer deposition (ALD) process. In some examples, the Si-containing precursor monolayer 121 has a thickness of about 1 Å to about 2 Å. The formation of the Si-containing precursor monolayer 121 can avoid material loss in the first fin 110a and the second fin 110b, more specifically for the Ge-containing layer 103 of the fins 110a and 110b.

Figure 2C:
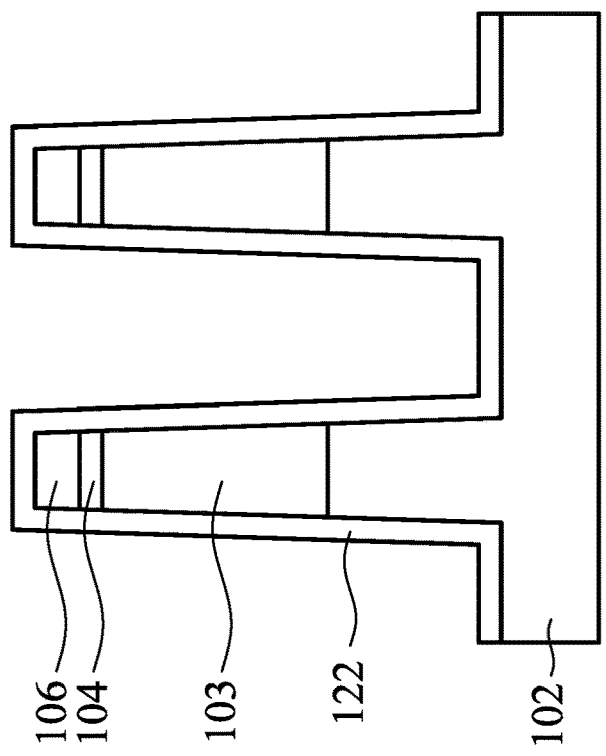

In block 206 of the method 200 as shown in FIG. 3, a silicon oxide layer 122, for example a $SiO_2$ layer, is formed over the first fin 110a and the second fin 110b, as shown in FIG. 2C in accordance with some embodiments. The silicon oxide layer 122 is conformally formed on the sidewalls of the first fin 110a and the second fin 110b, the exposed surface of the substrate 102, and the sidewalls and the top surface of the mask 105. The silicon oxide layer 122 may be formed by the subsequent steps of the first ALD process following the Si-precursor pre-soak step of forming the Si-containing precursor monolayer 121. In the block 206, the Si-containing precursor monolayer 121 is converted into one monoatomic layer of the silicon oxide layer 122. In some embodiments, the first ALD process is a thermal ALD process performed at a temperature that is lower than about 400° C., such that the profiles of the first fin 110a and the second fin 110b are not affected by the first ALD process. The first ALD process is performed by cycles of Si-containing precursor adsorption and oxidation. In some examples, the Si-containing precursor may be an amino silane gas which is selected from the group consisting of bisdiethylaminosilane (BDEAS), diisopropylaminosilane (DIPAS), trisdimethylaminosilane (3DMAS), hexakisethylaminosilane (HEAD), hexakis(ethylamino)disilane (HEADS) and bisethylmethylaminosilane (BEMAS). The oxidation may be performed by using an oxidant such as ozone. In some examples, the silicon oxide layer 122 has a thickness of about 10 Å to about 30 Å.

In block 208 of the method 200 as shown in FIG. 3, optionally, a silicon oxynitride layer 123, for example a SiON layer, is formed on the silicon oxide layer 122 using a post-nitridation process, as shown in FIG. 2D in accordance with some embodiments. The silicon oxynitride layer 123 is conformally formed on the silicon oxide layer 122, as shown in FIG. 2D in accordance with some embodiments. In some other embodiments, the silicon oxide layer 122 may be completely converted into the silicon oxynitride layer 123, and then the silicon oxynitride layer 123 is directly formed on the sidewalls of the first fin 110a and the second fin 110b, the exposed surface of the substrate 102, and the sidewalls and the top surface of the mask 105 (not shown in FIG. 2D).

In some embodiments, the post-nitridation process of forming the silicon oxynitride layer 123 is performed on the silicon oxide layer 122 in a plasma nitridation process, a post-nitridation annealing process, or a combination thereof.

In the plasma nitridation process, the silicon oxide layer 122 is nitrided with nitrogen plasma generated through a surface-wave plasma (SWP) or inductively coupled plasma (ICP) source. In some examples, gas used for the plasma nitridation process may be, but not limited to, inert gas such as He or Ar, and N-containing gas such as $N_2$, $N_2O$ or $NH_3$. In some other examples, gas used for the plasma nitridation process may be, but not limited to, inert gas such as He or Ar, and H-containing gas such as $H_2$ with N-containing gas such as $N_2$ at a ratio of the N-containing gas to the H-containing gas in flow rate of about 0.1% to about 5%. In some examples, the plasma is ICP mode with a frequency of about 13.56 MHz to about 2.45 GHz. A power of the ICP mode plasma may be in a range from about 1000 W to about 4000 W. The duration of the ICP mode plasma nitridation process may be in a range from about 2 seconds to about 180 seconds.

In some examples, the post-nitridation annealing process may be a spike annealing process or a soak annealing process performed at a temperature of about 500° C. to about 900° C. The duration of the post-nitridation annealing process may be in a range from about 1.2 seconds to about 30 seconds.

Moreover, in blocks 204 to 208, the process pressure may be in a range from about 900 mtorr to about 2200 mtorr. In the block 204 and the block 208, the process temperature may be in a range from about 250° C. to about 450° C. In the block 206, the process temperature may be in a range from about 250° C. to lower than about 400° C.

Figure 2F:
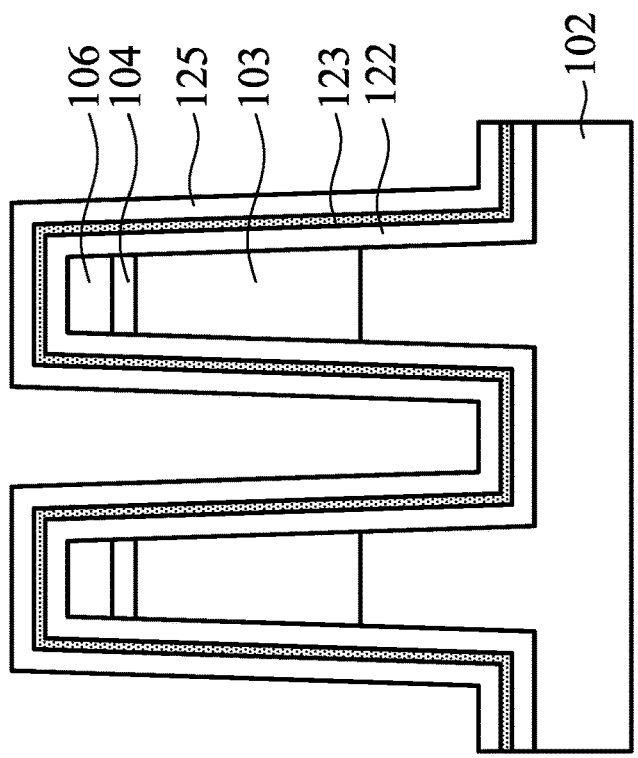
Figure 2E:
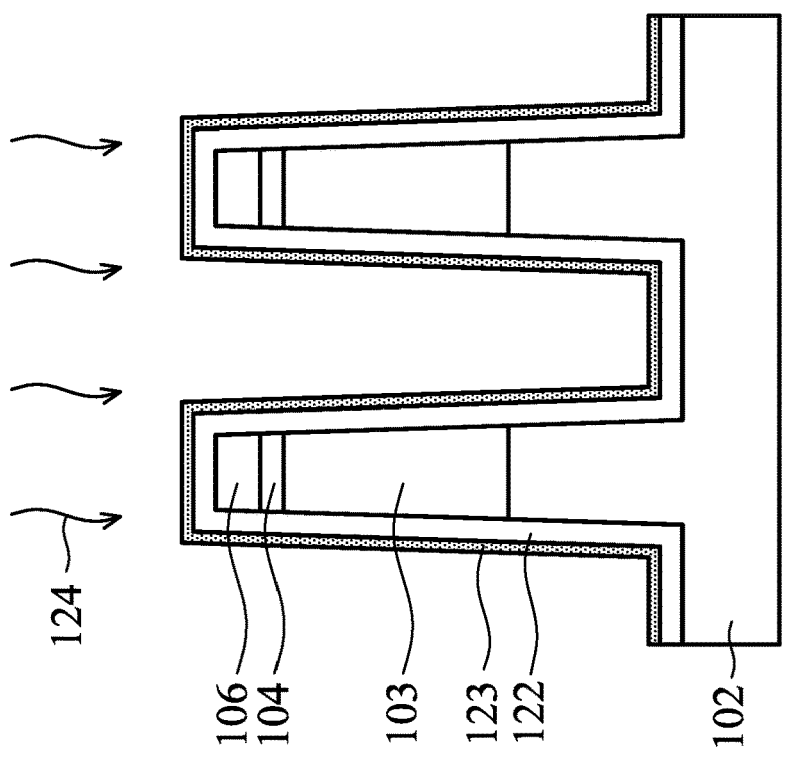

Next, in block 210 of the method 200 as shown in FIG. 3, the silicon oxynitride layer 123 is modified by surface pre-treatment 124 to form a Si—N or Si—$NH_2$ terminated surface, as shown in FIG. 2E in accordance with some embodiments. The surface pre-treatment 124 may be performed using a plasma nitridation process. In some examples, the silicon oxynitride layer 123 is modified with nitrogen plasma generated through an inductively coupled plasma (ICP) source. In some examples, gas used for the surface pre-treatment 124 may be, but not limited to, inert gas such as He or Ar, and N-containing gas such as $N_2$ or $NH_3$. In some other examples, gas used for the surface pre-treatment 124 may be, but not limited to, inert gas such as He or Ar, and H-containing gas such as $H_2$ with N-containing gas such as $N_2$ at a ratio of the N-containing gas to the H-containing gas in flow rate of about 1% to about 50%. In some examples, the plasma used in the surface pre-treatment 124 is ICP mode plasma with a frequency of about 2.45 MHz. A power range of the ICP mode plasma may be from about 1500 W to about 2500 W. The duration of the surface pre-treatment 124 with the ICP mode plasma may be in a range from about 6 seconds to about 30 seconds.

In block 212 of the method 200 as shown in FIG. 3, a silicon nitride layer 125, for example a SiN layer, is formed over the silicon oxynitride layer 123 using a second ALD process, as shown in FIG. 2F in accordance with some embodiments. The silicon nitride layer 125 is conformally formed on the silicon oxynitride layer 123, as shown in FIG. 2F in accordance with some embodiments. In some embodiments, the second ALD process is a thermal ALD process or a plasma enhanced ALD (PEALD) process. The second ALD process is performed by cycles of Si-containing precursor adsorption and nitridation. In some examples, the Si-containing precursor may be a silane gas which is selected from the group consisting of dichlorosilane (DCS), tetrachlorosilane (TCS), hexachlorodisliane (HCD) and monosilane. The nitridation may be performed by using an N-containing gas such as ammonia gas ($NH_3$). In some examples, the silicon nitride layer 125 has a thickness of about 20 Å to about 50 Å.

In some embodiments, the silicon nitride layer 125 is formed using a thermal ALD process followed by in-situ $H_2$ plasma treatment. The thermal ALD process may be performed by the same processing parameters as the above description of the first ALD process. The in-situ $H_2$ plasma treatment is performed in the same ALD process chamber for depositing the silicon nitride layer 125. In some examples, the in-situ $H_2$ plasma treatment is performed by using ICP mode plasma with a frequency of about 2.45 MHz. A power range of the ICP mode plasma may be from about 1500 W to about 2500 W. The duration of the in-situ $H_2$ plasma treatment with ICP mode plasma for the silicon nitride layer 125 may be in a range from about 2 seconds to about 180 seconds.

Figure 2H:
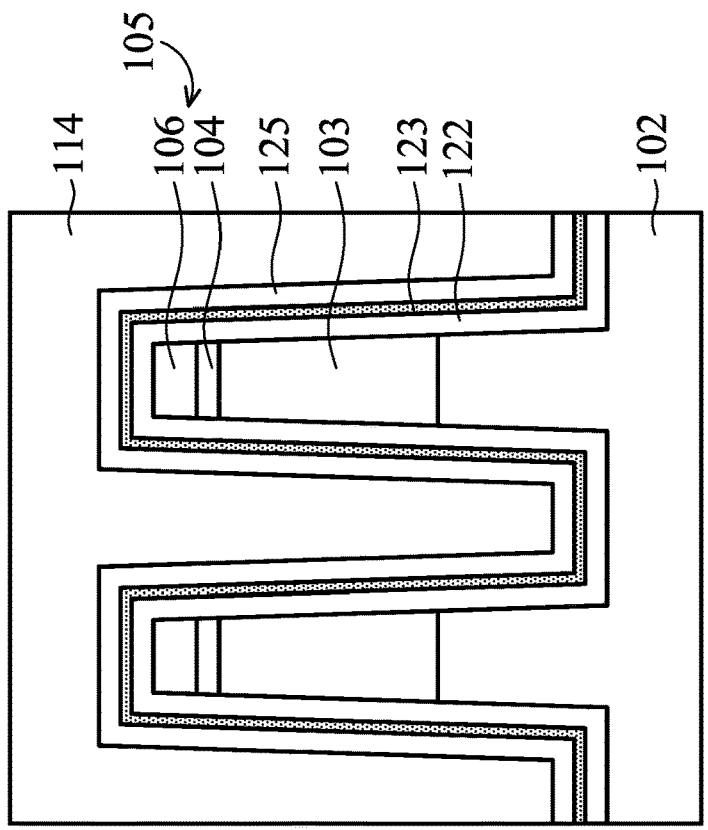
Figure 2G:
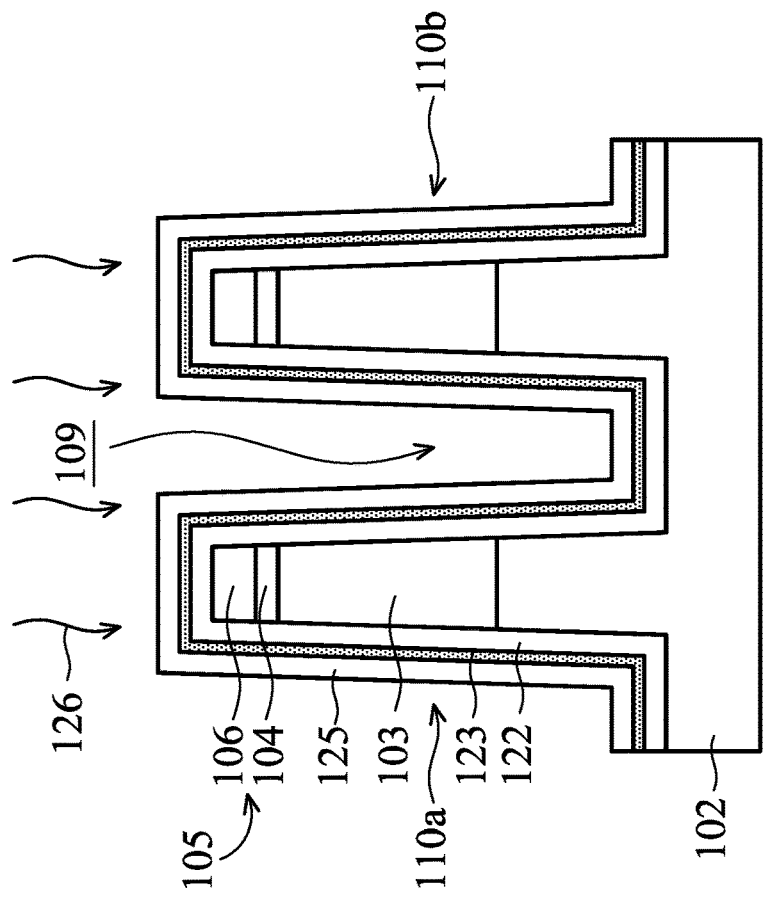

Next, in block 214 of the method 200 shown in FIG. 3, a post-treatment 126 is performed on the silicon nitride layer 125 by applying $H_2$ plasma, as shown in FIG. 2G in accordance with some embodiments. The post-treatment 126 may be an ex-situ $H_2$ plasma treatment which may be performed after the in-situ $H_2$ plasma treatment performed on the silicon nitride layer 125 or may be performed individually without an in-situ $H_2$ plasma treatment on the silicon nitride layer 125. The ex-situ $H_2$ plasma treatment is performed out of the ALD process chamber for depositing the silicon nitride layer 125. In some examples, the ex-situ $H_2$ plasma treatment is performed by using ICP mode plasma with a frequency of about 2.45 MHz. A power range of the ICP mode plasma may be from about 1500 W to about 2500 W. The duration of the ex-situ $H_2$ plasma treatment with the ICP mode plasma may be in a range from about 2 seconds to about 180 seconds.

In some examples, in blocks 212 and 214, gas used for the in-situ $H_2$ plasma treatment and the ex-situ $H_2$ plasma treatment may be, but not limited to, inert gas such as He or Ar, and H-containing gas such as $H_2$ in a flow rate from about 500 sccm to about 5000 sccm.

Next, in block 216 of the method 200 as shown in FIG. 3, an insulating layer 114 is formed to fill the trench 109 between the first fin 110a and the second fin 110b (as shown in FIG. 2G) over the substrate 102, as shown in FIG. 2H in accordance with some embodiments. The insulating layer 114 also covers the mask 105, the silicon nitride layer 125 and the substrate 102, as shown in FIG. 2H in accordance with some embodiments. The top surface of the insulating layer 114 may be higher than the top surface of the silicon nitride layer 125. The material and the process for forming the insulating layer 114 may be the same as those described in FIG. 1D, and the details are not repeated herein.

Figure 2I:
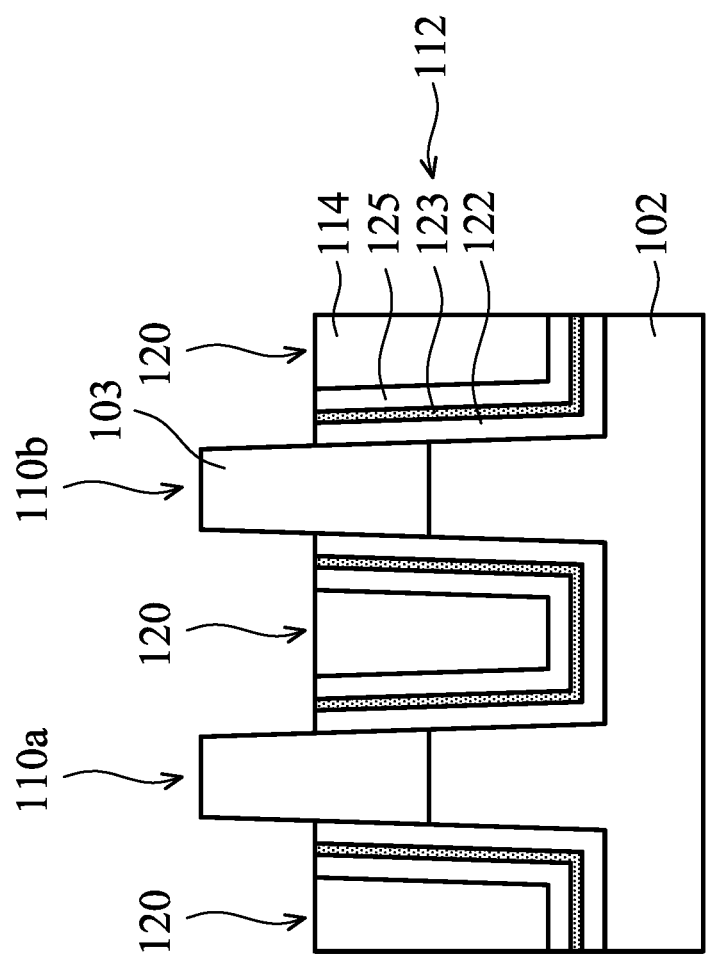

In block 218 of the method 200 as shown in FIG. 3, the insulating layer 114, the silicon oxide layer 122, the silicon oxynitride layer 123 and the silicon nitride layer 125 are recessed to form the isolation structure 120 with the liner 112, as shown in FIG. 2I in accordance with some embodiments. The isolation structure 120 includes the insulating filler 114 and the liner 112. In some embodiments, the liner 112 includes the recessed silicon oxide layer 122, the recessed silicon oxynitride layer 123 and the recessed silicon nitride layer 125 as shown in FIG. 2I in accordance with some embodiments. It should be noted that, in accordance with the standard practice in the industry, the liner 112 is not drawn to scale. In fact, the dimension of the liner 112 is arbitrarily increased for clarity of discussion. The top surface of the isolation structure 120 is lower than the top surfaces of the first fin 110a and the second fin 110b. In some embodiments, the top surface of the isolation structure 120 is higher than or level with the bottom surfaces of the Ge-containing layers 103 of the first fin 110a and the second fin 110b. The process of recessing the insulating layer 114, the silicon oxide layer 122, the silicon oxynitride layer 123 and the silicon nitride layer 125 may be the same as those described in FIG. 1E, and are not repeated herein.

According to some embodiments of the disclosure, the formation of the Si-containing precursor monolayer 121 can protect the first fin 110a and the second fin 110b and help for the formation of the silicon oxide layer 122 during the first ALD process. Moreover, according to some embodiments of the disclosure, since the silicon oxide layer 122 is formed in the first ALD process, not a thermal oxidation process, the first fin 110a and the second fin 110b do not undergo material loss and there is no interface trap formation between the top and bottom portions of the fin. Therefore, the Ge-containing layer 103 of the first fin 110a and the second fin 110b, which is used as the channel region of the semiconductor devices, would not be affected by the formation of the silicon oxide layer 122. The semiconductor devices do not have channel loss issue according to some embodiments of the disclosure. Therefore, the performance of the semiconductor devices according to some embodiments of the disclosure can be improved.

In addition, the bottom portions of the fins 110a and 110b which is formed from the silicon substrate 102 are used as a well region of the semiconductor device. According to some embodiments, the silicon oxide layer 122 formed on the bottom portions of the fins 110a and 110b can prevent a fixed charge close to the well region, compared to forming a silicon nitride layer directly on the fins 110a and 110b. Therefore, the formation of the silicon oxide layer 122 as the inner layer on the fins 110a and 110b by the first ALD process can prevent leakage in the well junction.

Moreover, according to some embodiments, modifying the silicon oxynitride layer 123 by the surface pre-treatment 124 to form the Si—N or Si—NH$_2$ terminated surface is better for the Si-precursor adhesion. Therefore, the Si—N or Si—NH$_2$ terminated surface can help the incubation of the silicon nitride layer 125 to make the deposition of the silicon nitride layer 125 more easy.

In addition, according to some embodiments, through the in-situ H$_2$ plasma treatment, the ex-situ H$_2$ plasma treatment or the combination thereof performed on the silicon nitride layer 125, the impurities in the silicon nitride layer 125 are removes, and also make the silicon nitride layer 125 densify. The impurities in the silicon nitride layer 125 are for example chlorine from the Si-containing precursor for forming the silicon nitride layer 125. Accordingly, the quality of the silicon nitride layer 125 is improved to enhance steam resistivity of the liner 112 of the isolation structure 120. Therefore, the reliability of the semiconductor devices according to some embodiments of the disclosure can be enhanced. In addition, the formation of the silicon oxynitride layer 123 also can improve steam resistivity of the liner 112 of the isolation structure 120.

Now, referring to FIGS. 4A-4H, which are cross-sectional views of respective intermediate structures for forming the isolation structure 120 of FIG. 1E, when taken along line I-I in FIGS. 1B-1E, in accordance with some embodiments. Some processes and materials used to form the intermediate structures shown in FIGS. 4A-4H are similar to, or the same as, those used to form the intermediate structures shown in FIGS. 1B-1E and are not repeated herein. At the same time, referring to FIG. 5, which is a flow chart of an example method 300 of forming an isolation structure with a liner corresponding to respective intermediate structures of FIGS. 4A-4H, in accordance with some embodiments.

Figure 4D:
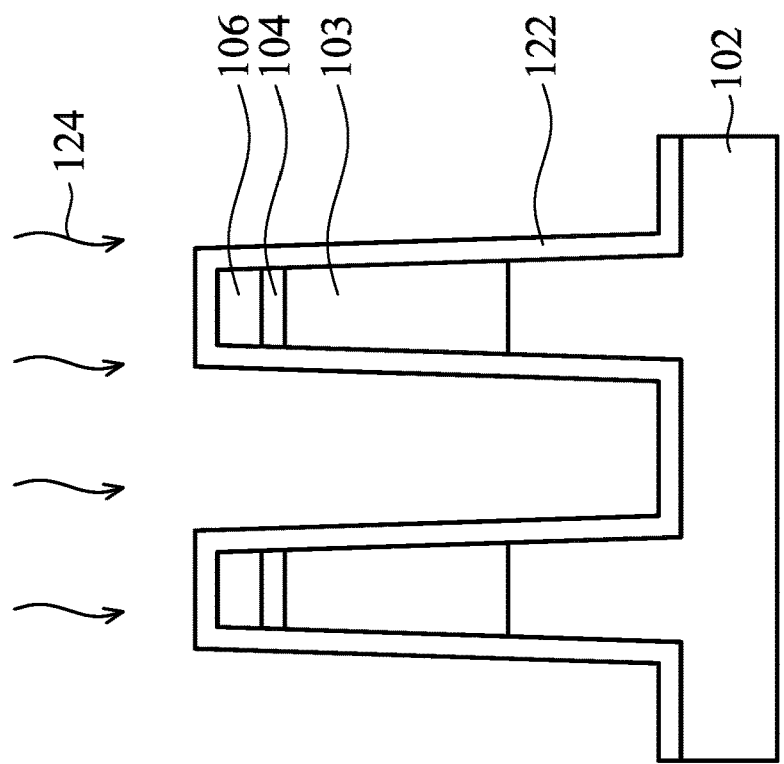
Figure 4C:
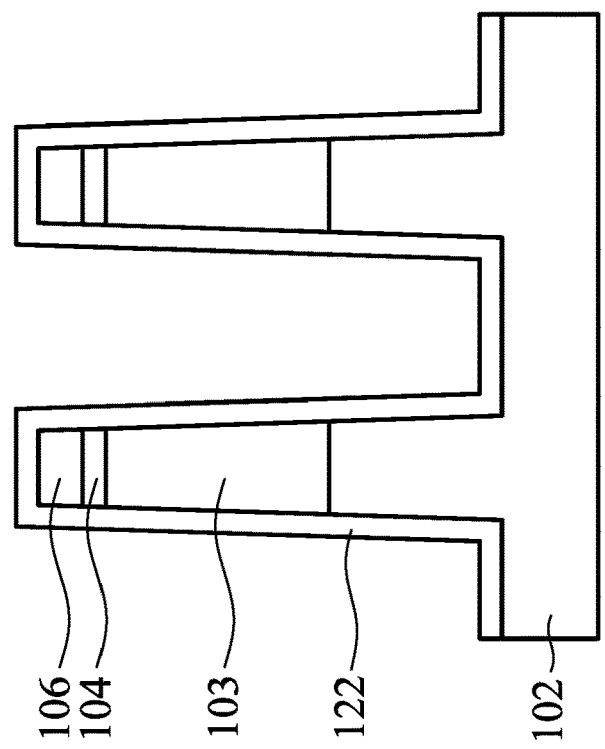
Figure 5:
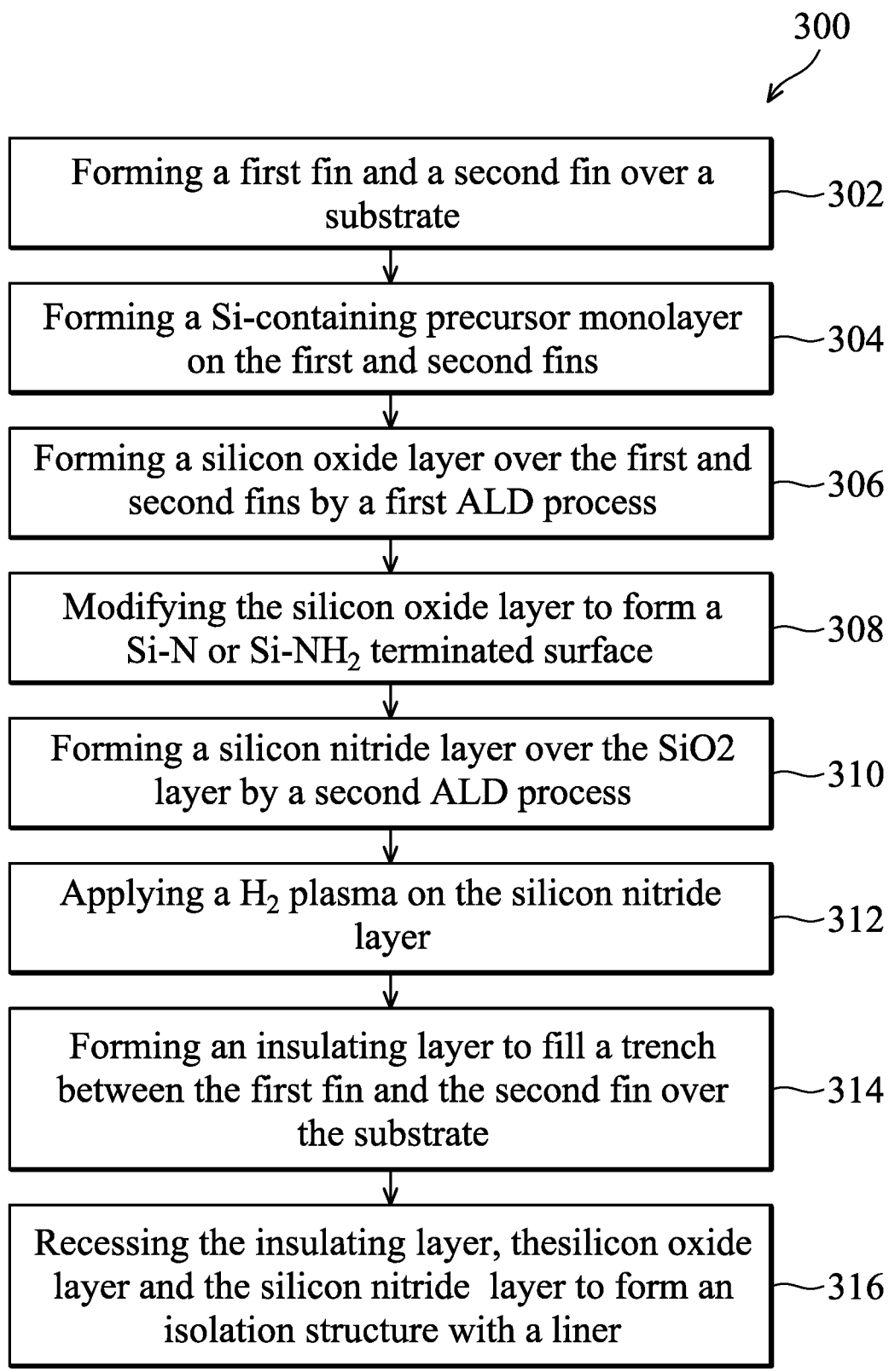
FIG. 5 is a flow chart of an example method of forming intermediate structures of the semiconductor device shown in FIGS. 4A-4H, in accordance with some embodiments.

As shown in FIGS. 4A-4C and in blocks 302-306 of the method 300 shown in FIG. 5, the materials and the processes for forming the first fin 110a and the second fin 110b, the mask 105, the Si-containing precursor monolayer 121 and the silicon oxide layer 122 are the same as or similar to those as described in FIGS. 2A-2C and in blocks 202-206 of the method 200, and the details are not repeated herein.

In block 308 of the method 300 as shown in FIG. 5, the silicon oxide layer 122 is modified by surface pre-treatment 124 to form a Si—N or Si—NH$_2$ terminated surface, as shown in FIG. 4D in accordance with some embodiments. The surface pre-treatment 124 may be performed using a plasma nitridation process. In some examples, the silicon oxide layer 122 may be modified with nitrogen plasma generated through an inductively coupled plasma (ICP) source. In some examples, gas used for the surface pre-treatment 124 may be, but not limited to, inert gas such as He or Ar, and N-containing gas such as N$_2$ or NH$_3$. In some other examples, gas used for the surface pre-treatment 124 may be, but not limited to, inert gas such as He or Ar, and H-containing gas such as H$_2$ with N-containing gas such as N$_2$ at a ratio of the N-containing gas to the H-containing gas in flow rate of about 1% to about 50%. In some examples, the plasma used in the surface pre-treatment 124 is ICP mode plasma with a frequency of about 2.45 MHz. A power range of the ICP mode plasma may be from about 1500 W to about 2500 W. The duration of the surface pre-treatment 124 with the ICP mode plasma may be in a range from about 6 seconds to about 30 seconds.

Figure 4F:
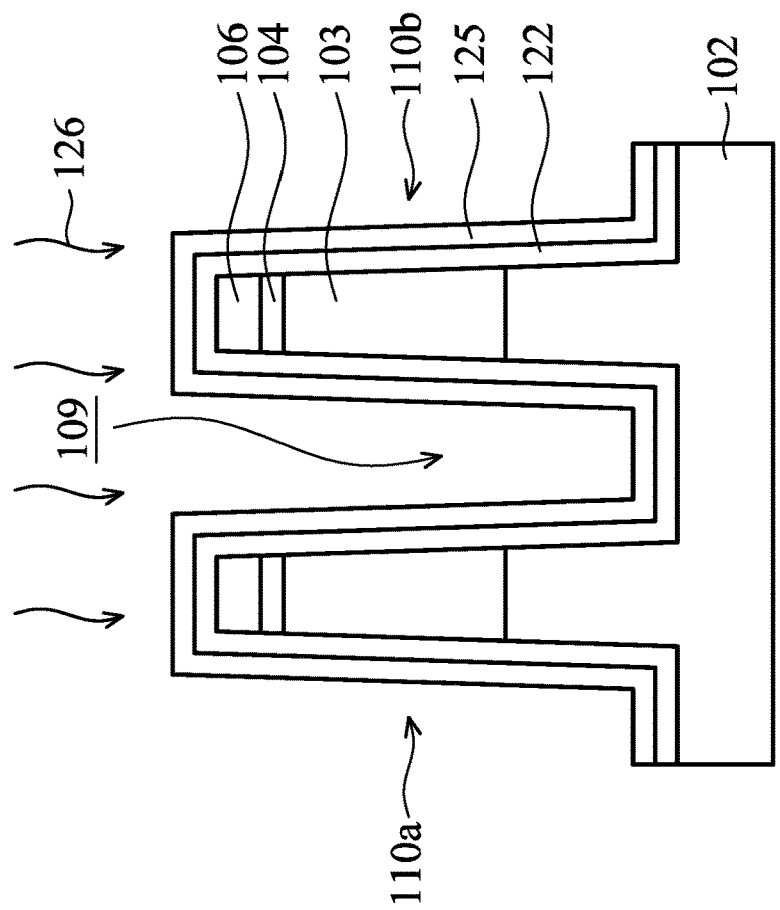
Figure 4E:
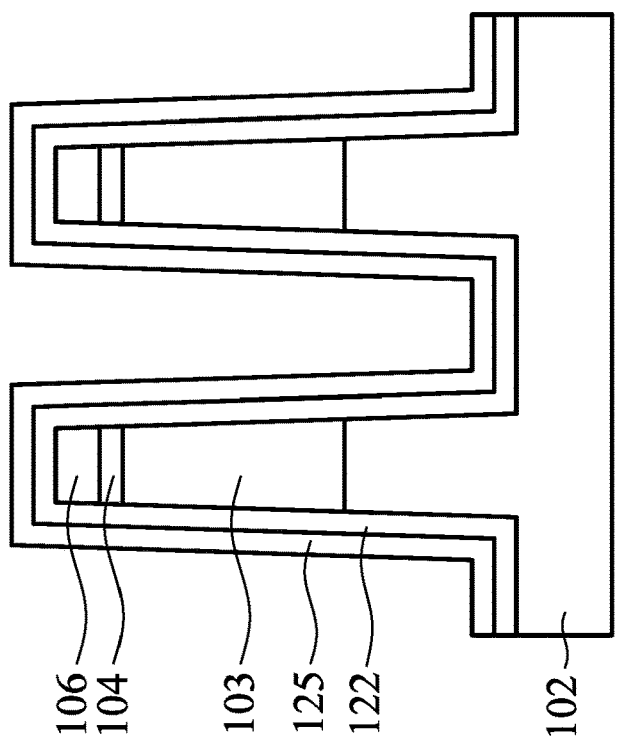

In block 310 of the method 300 as shown in FIG. 5, a silicon nitride layer 125 is formed over the silicon oxide layer 122 using a second ALD process, as shown in FIG. 4E in accordance with some embodiments. The silicon nitride layer 125 is conformally formed on the silicon oxide layer 122 as shown in FIG. 4E in accordance with some embodiments. In some embodiments, the second ALD process is a thermal ALD process or a PEALD process. The second ALD process is performed by cycles of Si-containing precursor adsorption and nitridation. In some examples, the Si-containing precursor may be a silane gas which is selected from the group consisting of dichlorosilane (DCS), tetrachlorosilane (TCS), hexachlorodisliane (HCD) and monosilane. The nitridation process is performed by using a N-containing gas such as ammonia gas (NH$_3$). In some examples, the silicon nitride layer 125 has a thickness of about 20 Å to about 50 Å, for example.

In some embodiments, the silicon nitride layer 125 is formed using a thermal ALD process followed by in-situ H$_2$ plasma treatment. The thermal ALD process may be performed by the same processing parameters as the above description. In some examples, the in-situ H$_2$ plasma treatment is performed by using ICP mode plasma with a frequency of about 2.45 MHz. A power range of the ICP mode H$_2$ plasma may be from about 1500 W to about 2500 W. The duration of the in-situ H$_2$ plasma treatment with ICP mode plasma may be in a range from about 2 seconds to about 180 seconds.

Figure 4G:
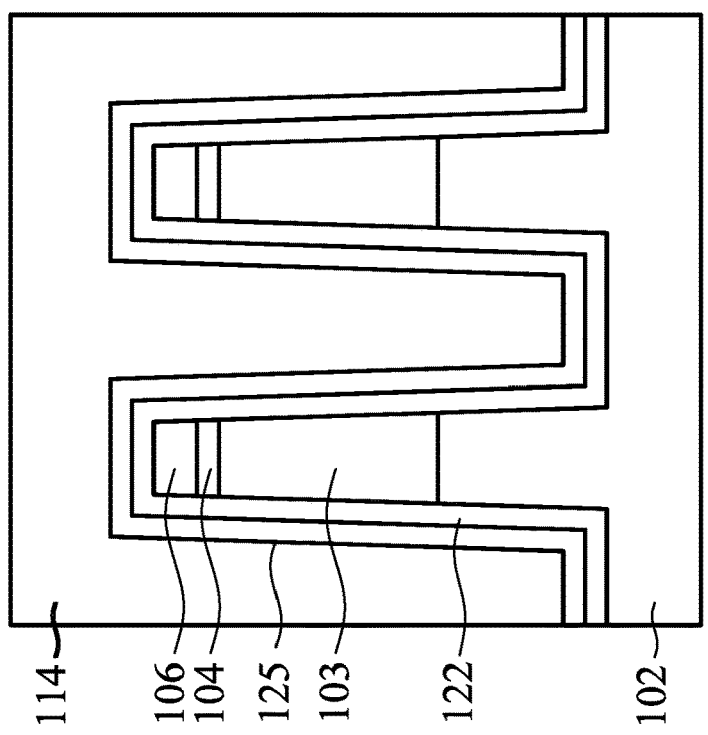
Figure 4H:
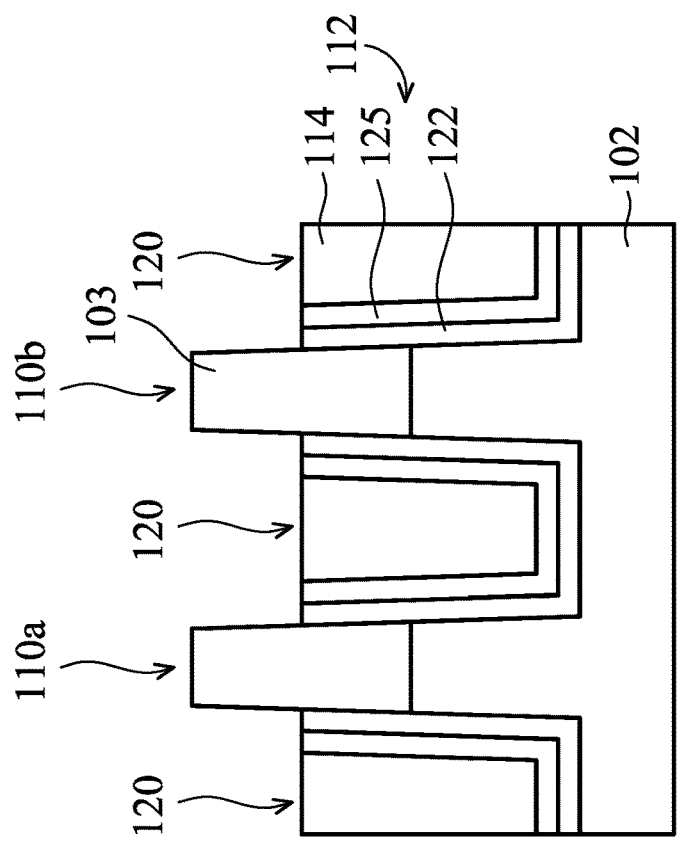

Next, as shown in FIGS. 4F-4H and in blocks 312-316 of the method 300 shown in FIG. 5, the post-treatment 126 performed by applying a H$_2$ plasma on the silicon nitride layer 125, the material and the process of forming the insulating layer 114 to fill the trench 109 between the first fin 110a and the second fin 110b, and the processes of recessing the insulating layer 114, the silicon oxide layer 122 and the silicon nitride layer 125 and removing the mask 105 to form an isolation structure 120 with a liner 112 are the same as or similar to those as described in FIGS. 2G-2I and in blocks 214-218 of the method 200, and the details are not repeated herein.

Figure 1F:
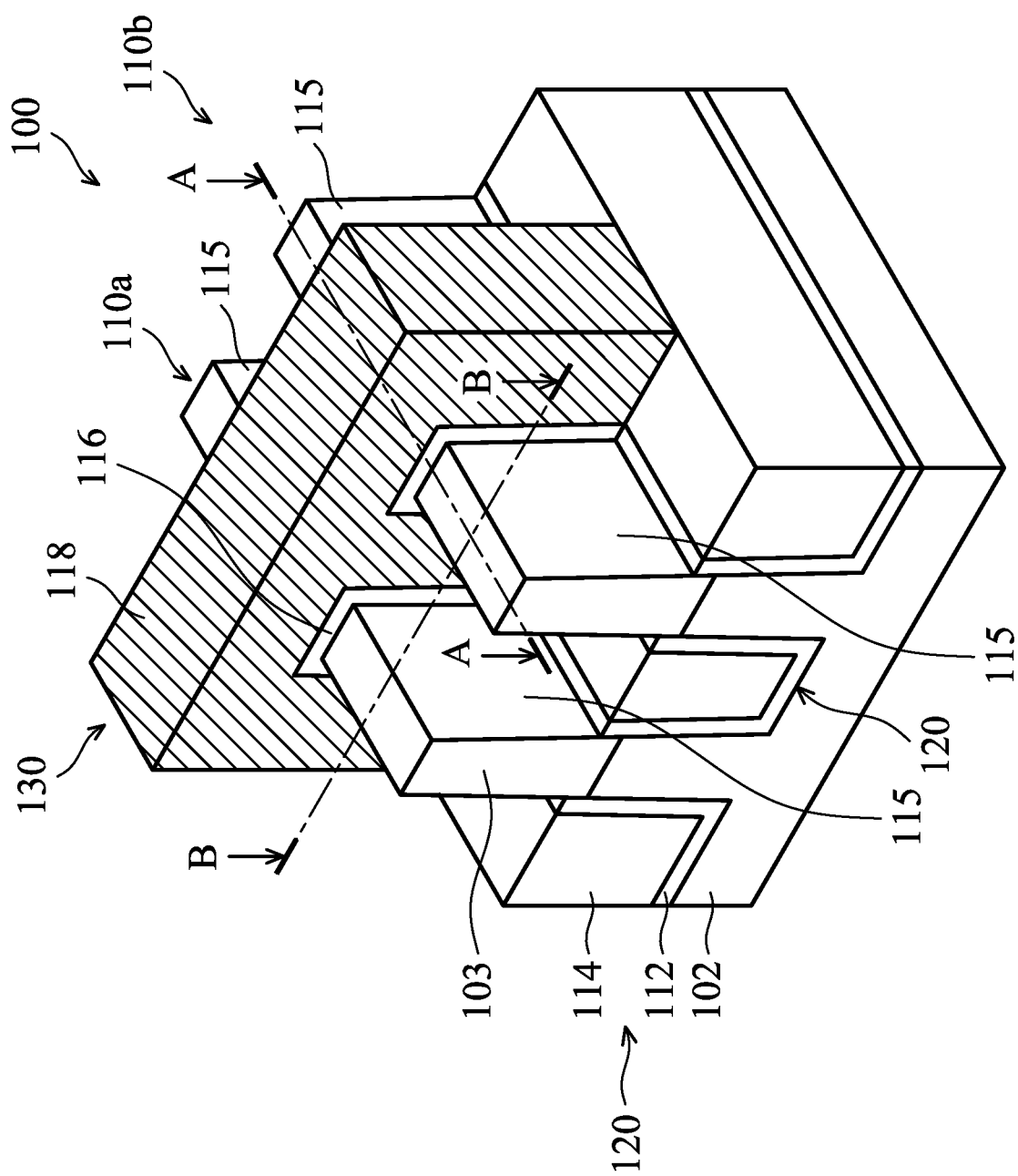

FIG. 1F is a perspective view of a semiconductor device 100 in accordance with some embodiments. A gate dielectric layer 116 is formed on and across the fins 110a and 110b, and the gate dielectric layer 116 is also formed on the isolation structures 120, as shown in FIG. 1F in accordance with some embodiments. In addition, a gate electrode layer 118 is formed on the gate dielectric layer 116. A gate structure 130 includes the gate dielectric layer 116 and the gate electrode layer 118. The longitudinal direction of the gate structure 130 is perpendicular to the longitudinal direction of the fins 110a and 110b.

In some embodiments, the semiconductor device 100 is fabricated using a gate-first process. In these embodiments, the gate dielectric layer 116 may include or be made of a high dielectric constant (high-k) dielectric material, such as having a k value greater than about 7.0, which may include a metal oxide or silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 116 may be deposited by molecular-beam deposition (MBD), ALD, plasma enhanced CVD (PECVD), or another deposition process. The gate electrode layer 118 may include or be made of a metal-containing material, such as TiN, TaN, TaC, Co, Ru, Al, multi-layers thereof, or a combination thereof, and may be deposited by CVD, PVD, or another deposition process. In addition, source and drain regions 115 are formed in the fins 110a and 110b at the opposite sides of the gate structure 130.

In some embodiments, the gate dielectric layer 116 is a dummy gate dielectric layer and the gate electrode layer 118 is a dummy gate electrode layer. A dummy gate structure 130 constructed by the dummy gate dielectric layer 116 and the dummy gate electrode layer 118 are replaced by a replaced gate structure using a gate-late process. The replaced gate structure includes a high-k gate dielectric layer and a metal gate electrode layer. The detail of materials and processes for forming the replaced gate structure will be described later as referring to cross-sectional views shown in FIGS. 6A-6B, 7A-7B, 8A-8B, and 9A-9B.

FIG. 1F further illustrates reference cross-sections that are used in FIGS. 6A-6B, 7A-7B, 8A-8B, and 9A-9B. Cross-section A-A is in a plane along a channel region in the fin 110b between opposing source/drain regions 115. Cross-section B-B is in a plane perpendicular to cross-section A-A and is across source/drain regions 115 in fins 110a and 110b. FIGS. 6A, 7A, 8A, and 9A ending with an "A" designation illustrate cross-sectional views at various stages of processing corresponding to cross-section A-A, and FIGS. 6B, 7B, 8B, and 9B ending with a "B" designation illustrate cross-sectional views at various stages of processing corresponding to cross-section B-B.

Figure 6B:
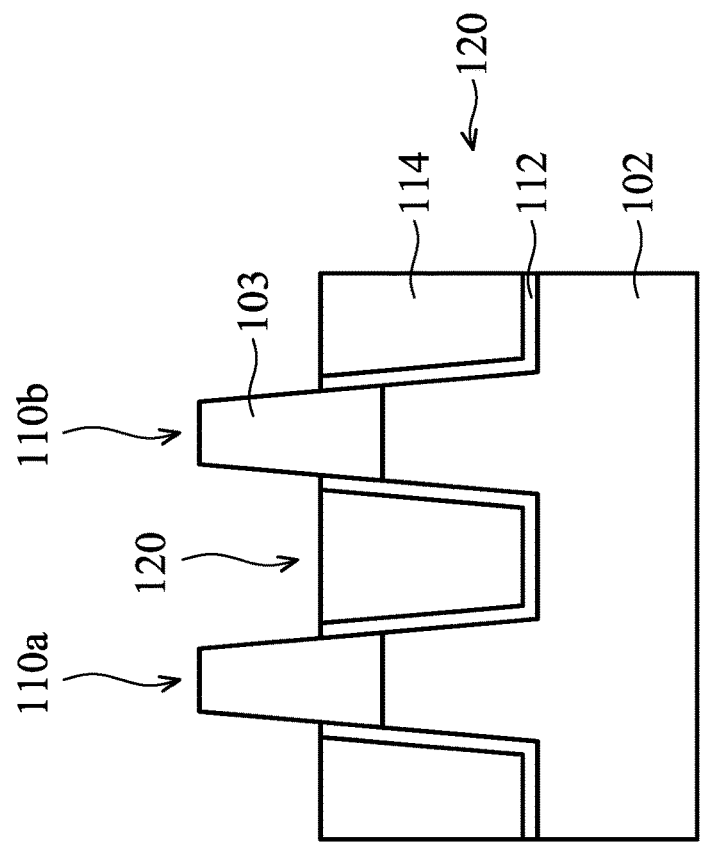
Figure 6A:
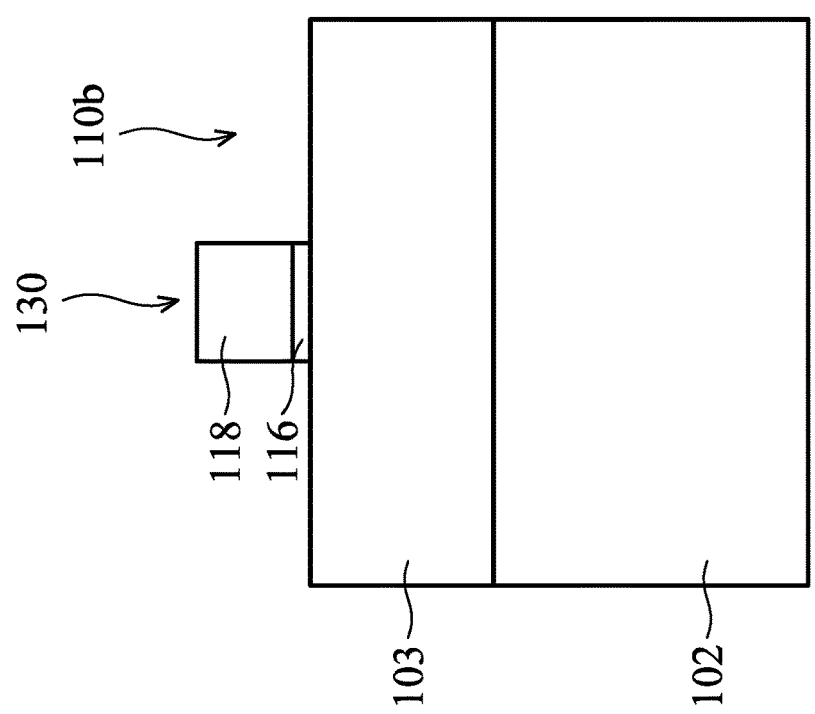

The dummy gate dielectric layer 116 and the dummy gate electrode layer 118 of the dummy gate structure 130 are formed on the Ge-containing layer 103 of the fin 110b, as shown in FIG. 6A in accordance with some embodiments. In some examples, the dummy gate dielectric layer 116 may include dielectric materials, such as silicon oxide, silicon nitride, silicon oxynitride, or a combination thereof. In some examples, the dummy gate electrode layer 118 is made of polysilicon. The dummy gate dielectric layer 116 and the dummy gate electrode layer 118 are independently formed using a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In addition, the fins 110a and 110b protrude from and between the isolation structures 120, as shown in FIG. 6B in accordance with some embodiments.

Next, gate spacers 119 are formed along sidewalls of the dummy gate structure 130, as shown in FIG. 7A in accordance with some embodiments. In some examples, the gate spacers 119 are made of silicon oxide, silicon nitride, silicon oxynitride, another dielectric material, or a combination thereof. The gate spacers 119 may be formed by CVD, ALD or another deposition process. Then, recesses 131 for source/drain regions are formed in the Ge-containing layer 103 of the fins 110a and 110b, as shown in FIGS. 7A and 7B in accordance with some embodiments. The recesses 131 may be formed using a dry etch process, such as RIE, NBE or other suitable process, or using a wet etch process, such as using tetramethyalammonium hydroxide (TMAH), ammonium hydroxide ($NH_4OH$), or another etchant.

Figure 8B:
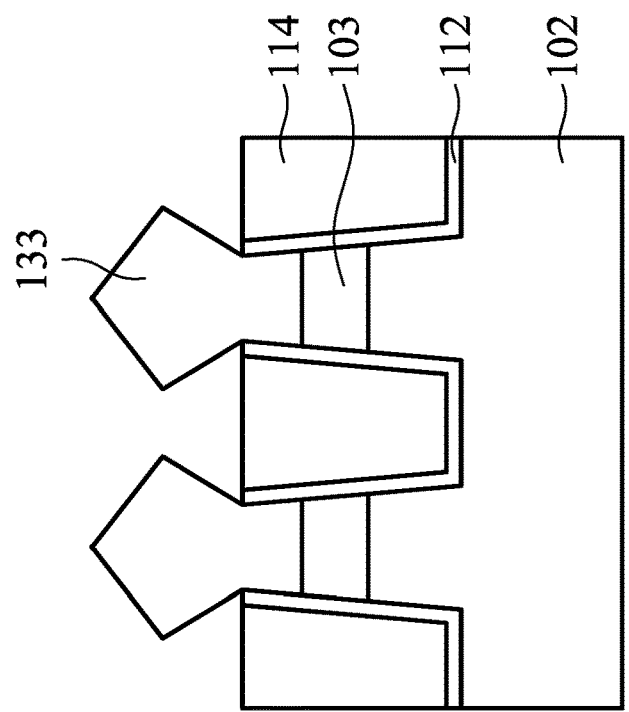
Figure 8A:
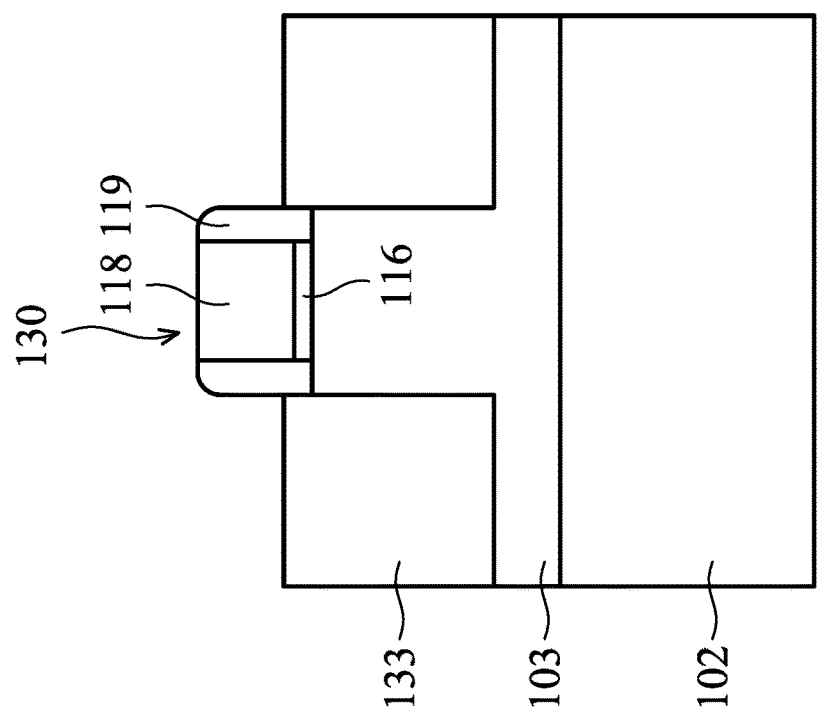

Next, epitaxy source/drain regions 133 are formed in the recesses 131 (shown in FIGS. 7A-7B), as shown in FIGS. 8A-8B in accordance with some embodiments. The epitaxy source/drain regions 133 may be made of silicon germanium ($Si_xGe_{1-x}$, where x can be between approximately 0 and 1), silicon carbide, silicon phosphorus, silicon carbon phosphorus, pure germanium, a III-V compound semiconductor, a II-VI compound semiconductor, or the like. The material of a III-V compound semiconductor is for example InAs, AlAs, GaAs, InP, GaN, InGaAs, InAlAs, GaSb, AlSb, AlP, GaP, and the like. The epitaxy source/drain regions 133 may be formed in the recesses 131 by an epitaxial growth process, such as metal-organic CVD (MOCVD), molecular beam epitaxy (MBE), liquid phase epitaxy (LPE), vapor phase epitaxy (VPE), selective epitaxial growth (SEG), or a combination thereof.

Figure 9B:
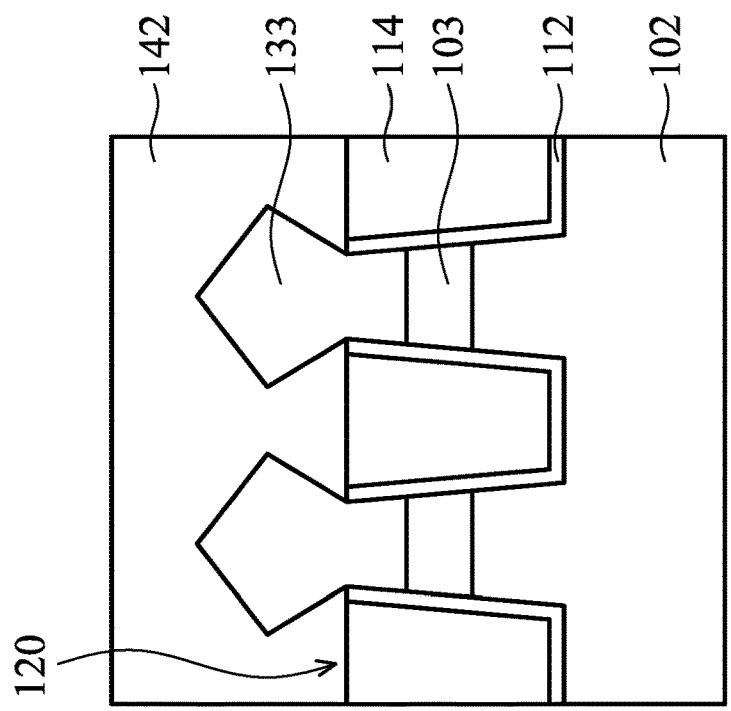
Figure 9A:
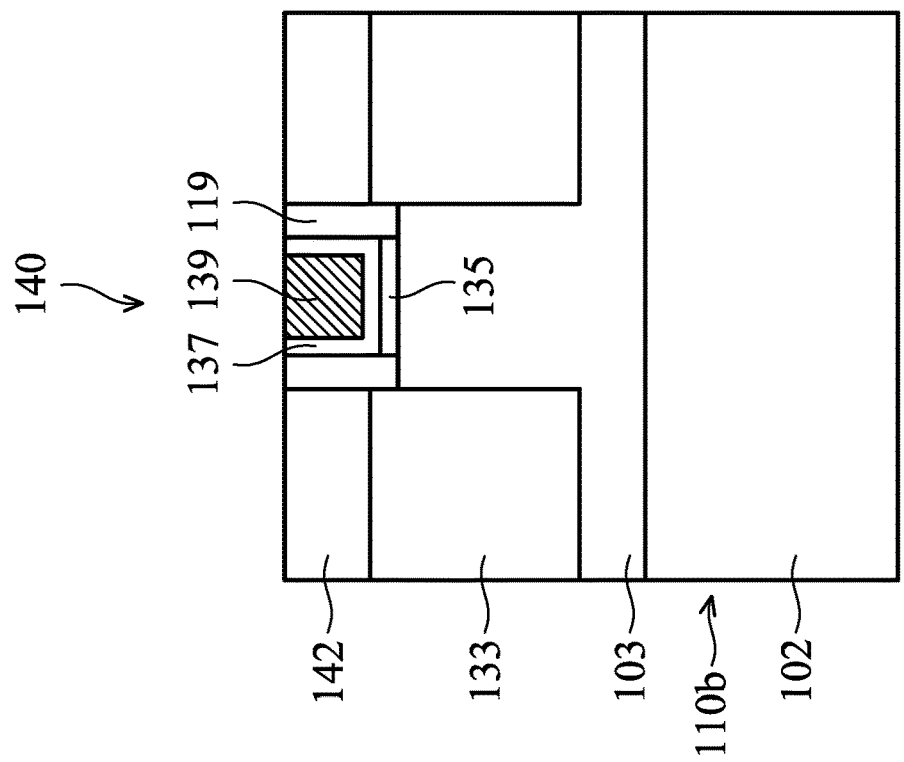

Next, an interlayer dielectric (ILD) layer 142 is formed over the epitaxy source/drain regions 133, the isolation structure 120, the gate spacers 119 and the dummy gate structure 130 (as shown in FIG. 8A), as shown in FIGS. 9A-9B in accordance with some embodiments. The ILD layer 142 may be made of silicon dioxide, silicon oxynitride, phosphosilicate glass (PSG), borosilicate glass (BSG), borophosphosilicate glass (BPSG), undoped silicate glass (USG), fluorinated silicate glass (FSG), Spin-On-Glass (SOG), the like, or a combination thereof. The ILD layer 142 may be deposited by spin-on coating, CVD, flowable CVD (FCVD), PECVD, PVD, or another deposition process.

Then, a planarization process, such as a CMP process, is performed on the ILD layer 142 until the top surface of the dummy gate structure 130 is exposed. Afterwards, the dummy gate structure 130 is removed by an etching process, such as RIE, NBE or other suitable process. A recess (not shown) is formed between the gate spacers 119. Next, a replaced gate structures 140 are formed in the recesses where the dummy gate structure 130 is removed. The replacement gate structures 140 includes an interfacial layer 135, a gate dielectric layer 137 and a gate electrode layer 139, as shown in FIG. 9A in accordance with some embodiments. The interfacial layer 135 may be formed on the Ge-containing layer 103 of the fin 110b along the channel region. The interfacial layer 135 may be made of silicon oxide, silicon nitride, and/or another dielectric material, and may be formed by CVD, ALD or another deposition process.

The gate dielectric layer 137 may be conformally deposited in the recess where the dummy gate structure 130 is removed. The gate dielectric layer 137 may be made of silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 137 may be deposited by ALD, PECVD, molecular beam deposition (MBD), or another deposition process. Although not shown in FIG. 9A, other functional layers, such as a capping layer, a barrier layer, and a work-function tuning layer may be formed between the gate dielectric layer 137 and the gate electrode layer 139.

The gate electrode layer 139 may fill remaining portions of the recess where the dummy gate structure 130 is removed. The gate electrode layer 139 may be made of a metal such as tungsten, cobalt, aluminum, ruthenium, copper, the like, or a combination thereof. The gate electrode layer 139 may be deposited by ALD, PECVD, MBD, PVD, or another deposition process. Afterwards, the semiconductor device 100, such as a FinFET device, is fabricated.

Embodiments for fabricating semiconductor devices are provided. The semiconductor devices are for example FinFET devices, which include an isolation structure 120 between two neighboring fins 110a and 110b. The isolation structure 120 includes a liner 112 conformally formed on the sidewalls of the fins 110a and 110b. In addition, the liner 112 is conformally formed on sidewalls and the bottom surface of a trench 109 between the fins 110a and 110b. It should be noted that the methods of forming the liner 112 of the isolation structure 120 between the fins 110a and 110b according to the embodiments can prevent material loss of the fins, specifically in the portion of the fins made of high-mobility material. The liner 112 includes a silicon oxide layer as an inner layer conformally formed on the fins 110a and 110b using a thermal ALD process at a temperature that is lower than about 400° C., so that no material loss occurs at the high-mobility material of the fins. The profile or shape of the fins 110a and 110b is not changed. The high-mobility material of the fins is used as a channel region of the FinFET devices. Therefore, the performance of the FinFET devices is improved due to there being no channel loss. Moreover, the silicon oxide layer 122 can avoid a fixed charge occurring at the interface between the liner 112 and the bottom portion of the fins 110a and 110b. The bottom portion of the fins 110a and 110b is used as a well region of the FinFET devices. Therefore, the silicon oxide layer 122 of the liner 112 according to the embodiments can prevent well-junction leakage.

In addition, the liner 112 further includes a silicon nitride layer 125 as an outer layer conformally deposited on the silicon oxide layer 122. Moreover, an $H_2$ plasma treatment is performed on the silicon nitride layer 125 to improve the quality of the silicon nitride layer. Therefore, steam resistivity of the liner 112 of the isolation structure 120 is enhanced. The silicon nitride layer 125 of the liner 112 according to the embodiments can effectively protect the fins 110a and 110b from being damaged by the following processes, such as a steam anneal process performed on the insulating filler 114 of the isolation structure 120. The reliability of the FinFET devices is also enhanced thereby.

As the semiconductor industry has progressed into nanometer technology process nodes, the space between the fins in the FinFET devices is more and more narrow. According to the above-mentioned benefits, the embodiments of the disclosure are suitable for the semiconductor devices at 5 nm process node (N5), N3 and beyond.

In addition, according to the embodiments, both the silicon oxide layer 122 and the silicon nitride layer 125 of the liner 112 have uniform thicknesses on the top portion and the bottom portion of the fins 110a and 110b. Moreover, there is no Ge pile-up at the interface between the silicon oxide layer 122 and the Ge-containing layer 103 of the fins 110a and 110b. In some embodiments, the liner 112 has a surface-rich nitrogen concentration depth profile in the silicon oxynitride layer 123 due to the post-nitridation process performed on the silicon oxide layer 122, which causes less of a nitrogen pile-up at the interface between the silicon oxynitride layer 123 and the channel region in the fins 110a and 110b. Therefore, the performance of the semiconductor devices can be improved.

In some embodiments, a method of fabricating a semiconductor device is provided. The method includes forming a first fin and a second fin over a substrate, and conformally forming a silicon oxide layer over the first fin using a first atomic layer deposition (ALD) process. The method also includes conformally forming a silicon nitride layer over the silicon oxide layer using a second atomic layer deposition (ALD) process, and forming an insulating layer to fill the trench between the first fin and the second fin over the substrate. The method further includes recessing the insulating layer, the silicon oxide layer and the silicon nitride layer to form an isolation structure with a liner. In addition, the method includes forming a gate structure over the first fin, and forming a source region and a drain region in the first fin and on opposite sides of the gate structure.

In some embodiments, a method of fabricating a semiconductor device is provided. The method includes forming a first fin and a second fin over a substrate and forming a mask layer on the first fin and the second fin, wherein both the first fin and the second fin include a silicon layer and a germanium-containing layer on the silicon layer. The method also includes conformally depositing a silicon oxide layer over the first fin, the second fin and the mask layer, and conformally depositing a silicon nitride layer over the silicon oxide layer. The method further includes forming an insulating layer to fill a trench between the first fin and the second fin over the substrate, and recessing the insulating layer, the silicon oxide layer and the silicon nitride layer and removing the mask layer to form an isolation structure with a liner. In addition, the method includes forming a gate structure over the first fin, and forming a source region and a drain region in the first fin and on opposite sides of the gate structure.

In some embodiments, a method of fabricating a semiconductor device is provided. The method includes forming a first fin and a second fin over a substrate, wherein there is a trench between the first fin and the second fin. The method also includes conformally depositing a silicon oxide layer on sidewalls and the bottom surface of the trench using an atomic layer deposition process, and conformally depositing a silicon nitride layer over the silicon oxide layer. The method further includes filling the trench with an insulating material on the silicon nitride layer, and recessing the insulating material, the silicon oxide layer and the silicon nitride layer to form an isolation structure with a liner. In addition, the method includes forming a gate structure over the first fin, and forming a source region and a drain region in the first fin and on opposite sides of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a first fin and a second fin over a substrate, wherein the first fin comprises a silicon layer and a germanium-containing layer over the silicon layer;
    forming a silicon oxide layer conformally over the first fin using a first atomic layer deposition (ALD) process;
    forming a silicon nitride layer conformally over the silicon oxide layer using a second atomic layer deposition (ALD) process;
    forming an insulating layer to fill a trench between the first fin and the second fin over the substrate;
    recessing the insulating layer, the silicon oxide layer and the silicon nitride layer to form an isolation structure with a liner;
    forming a gate structure over the first fin; and
    forming a source region and a drain region in the first fin and on opposite sides of the gate structure,
    wherein a top surface of the liner is higher than an interface between the silicon layer and the germanium-containing layer.

2. The method as claimed in claim 1, further comprising forming a silicon-containing precursor monoatomic layer conformally over the first fin before forming the silicon oxide layer.

3. The method as claimed in claim 1, further comprising:
    forming a silicon oxynitride layer on the silicon oxide layer using a post-nitridation process to convert the silicon oxide layer to the silicon oxynitride layer, wherein the post-nitridation process comprises a plasma-nitridation process, a nitridation-annealing process, or a combination thereof; and
    modifying the silicon oxynitride layer by a surface pre-treatment.

4. The method as claimed in claim 1, further comprising modifying the silicon oxide layer by a surface pre-treatment.

5. The method as claimed in claim 1, further comprising applying a $H_2$ plasma on the silicon nitride layer.

6. The method as claimed in claim 5, wherein applying the $H_2$ plasma is performed in-situ, ex-situ, or a combination thereof with the formation of the silicon nitride layer.

7. The method as claimed in claim 1, wherein the first atomic layer deposition process is a thermal ALD process performed at a temperature that is lower than about 400° C.

8. The method as claimed in claim 1, wherein the second atomic layer deposition process comprises a thermal ALD process or a thermal plasma-enhanced ALD process.

9. A method of fabricating a semiconductor device, comprising:
    forming a first fin and a second fin over a substrate and forming a mask layer on the first fin and the second fin, wherein both the first fin and the second fin comprise a silicon layer and a germanium-containing layer on the silicon layer;
    depositing a silicon oxide layer conformally over the first fin, the second fin and the mask layer;
    depositing a silicon nitride layer conformally over the silicon oxide layer;
    forming an insulating layer to fill a trench between the first fin and the second fin over the substrate;
    recessing the insulating layer, the silicon oxide layer and the silicon nitride layer and removing the mask layer to form an isolation structure with a liner;
    forming a gate structure over the first fin; and
    forming a source region and a drain region in the first fin and on opposite sides of the gate structure,
    wherein a top surface of the insulating layer is higher than a bottom surface of the germanium-containing layer.

10. The method as claimed in claim 9, wherein the mask layer comprises a pad oxide layer formed on the germanium-containing layers of the first fin and the second fin and a pad nitride layer formed on the pad oxide layer.

11. The method as claimed in claim 9, further comprising:
    forming a silicon oxynitride layer on the silicon oxide layer using a plasma-nitridation process, a nitridation-annealing process, or a combination thereof to convert the silicon oxide layer to the silicon oxynitride layer; and
    modifying the silicon oxynitride layer by a surface pre-treatment.

12. The method as claimed in claim 11, wherein the silicon oxynitride layer is modified by performing a plasma nitridation treatment on the silicon oxynitride layer.

13. The method as claimed in claim 9, further comprising modifying on the silicon oxide layer by a surface pre-treatment.

14. The method as claimed in claim 9, further comprising applying a $H_2$ plasma on the silicon nitride layer.

15. The method as claimed in claim 10, wherein the silicon oxide layer is deposited using a first atomic layer deposition (ALD) process, and the silicon nitride layer is deposited using a second atomic layer deposition (ALD) process.

16. A method of fabricating a semiconductor device, comprising:
    forming a first fin and a second fin over a substrate, wherein there is a trench between the first fin and the second fin, wherein the first fin comprises a silicon layer and a germanium-containing layer over the silicon layer;
    depositing a silicon oxide layer conformally on sidewalls and a bottom surface of the trench using an atomic layer deposition process;
    depositing a silicon nitride layer conformally over the silicon oxide layer;
    filling the trench with an insulating material on the silicon nitride layer;
    recessing the insulating material, the silicon oxide layer and the silicon nitride layer to form an isolation structure with a liner;
    forming a gate structure over the first fin; and
    forming a source region and a drain region in the first fin and on opposite sides of the gate structure, wherein a top surface of the liner is higher than a bottom surface of the germanium-containing layer.

17. The method as claimed in claim 16, further comprising:
  forming a silicon oxynitride layer between the silicon oxide layer and the silicon nitride layer using a nitridation process to convert the silicon oxide layer to the silicon oxynitride layer; and
  modifying the silicon oxynitride layer by a surface pre-treatment before forming the silicon nitride layer.

18. The method as claimed in claim 16, further comprising modifying the silicon oxide layer by a surface pre-treatment before forming the silicon nitride layer.

19. The method as claimed in claim 16, further comprising applying a $H_2$ plasma on the silicon nitride layer.

20. The method as claimed in claim 1, wherein the liner is a tri-layer structure.

* * * * *